United States Patent [19]

Marrocco, III et al.

[11] Patent Number: 5,654,392

[45] Date of Patent: *Aug. 5, 1997

[54] RIGID-ROD POLYMERS

[75] Inventors: Matthew Louis Marrocco, III, Santa Ana; Robert R. Gagné, Pasadena; Mark Steven Trimmer, Monrovia; Ying Wang, San Dimas, all of Calif.

[73] Assignee: Maxdem Incorporated, San Dimas, Calif.

[*] Notice: The term of this patent shall not extend beyond the expiration date of Pat. No. 5,646,231.

[21] Appl. No.: 369,161

[22] Filed: Jan. 5, 1995

Related U.S. Application Data

[63] Continuation of Ser. No. 847,351, Mar. 6, 1992, abandoned, which is a continuation-in-part of Ser. No. 397,732, Aug. 23, 1989, Pat. No. 5,227,457, which is a continuation-in-part of Ser. No. 157,451, Feb. 17, 1988, abandoned.

[51] Int. Cl.$^6$ .............................. C08G 8/02; C08G 14/00
[52] U.S. Cl. ............... 528/125; 528/126; 528/128; 528/171; 528/172; 528/174; 528/223; 528/226; 528/228; 528/224; 528/229; 528/397; 525/153
[58] Field of Search ..................... 528/125, 126, 528/128, 171, 172, 174, 220, 223, 226, 228, 224, 229, 397; 525/153

[56] References Cited

U.S. PATENT DOCUMENTS

| | | | |
|---|---|---|---|
| 3,431,221 | 3/1969 | Hoess | 528/14 |
| 3,582,498 | 6/1971 | Bilow et al. | 528/396 |
| 3,595,811 | 7/1971 | Bilow | 528/396 |
| 3,677,976 | 7/1972 | Miller et al. | 528/396 |
| 3,756,982 | 9/1973 | Korshak et al. | 508/124 |
| 3,826,783 | 7/1974 | Bloch | 528/183 |
| 3,998,864 | 12/1976 | Trevillyan | 556/16 |
| 4,108,835 | 8/1978 | Arnold et al. | 528/183 |
| 4,108,942 | 8/1978 | Chalk et al. | 525/275 |
| 4,207,407 | 6/1980 | Helminiak et al. | 525/425 |
| 4,229,566 | 10/1980 | Evers et al. | 528/185 |
| 4,263,466 | 4/1981 | Colon et al. | 585/421 |
| 4,284,834 | 8/1981 | Austin et al. | 585/25 |
| 4,326,989 | 4/1982 | Colon et al. | 502/162 |
| 4,377,546 | 3/1983 | Helminiak et al. | 264/232 |
| 4,384,107 | 5/1983 | Rogers et al. | 528/183 |
| 4,393,194 | 7/1983 | Guadiana et al. | 528/348 |
| 4,400,499 | 8/1983 | Colon | 528/274 |
| 4,433,132 | 2/1984 | Rogers et al. | 528/191 |
| 4,454,307 | 6/1984 | Cheshire | 525/379 |
| 4,461,886 | 7/1984 | Rogers et al. | 528/331 |
| 4,486,576 | 12/1984 | Colon et al. | 525/471 |
| 4,503,248 | 3/1985 | Gaudiana et al. | 564/307 |
| 4,511,623 | 4/1985 | Yoon et al. | 428/359 |
| 4,520,189 | 5/1985 | Rogers et al. | 528/331 |
| 4,525,413 | 6/1985 | Rogers et al. | 428/212 |
| 4,606,875 | 8/1986 | Chenevey et al. | 264/85 |
| 4,608,429 | 8/1986 | Rogers et al. | 528/194 |
| 4,614,784 | 9/1986 | Kozakiewicz | 527/313 |
| 4,628,125 | 12/1986 | Rogers et al. | 568/730 |
| 4,629,777 | 12/1986 | Pfeifer | 528/353 |
| 4,857,630 | 8/1989 | Kim | 528/397 |
| 4,977,223 | 12/1990 | Arnold et al. | 525/432 |
| 5,102,971 | 4/1992 | Himmler et al. | 528/167 |
| 5,151,472 | 9/1992 | Valia | 525/432 |
| 5,169,929 | 12/1992 | Tour et al. | 528/397 |

FOREIGN PATENT DOCUMENTS

| | | |
|---|---|---|
| 1129418 | 8/1982 | Canada. |
| 0436111A2 | 11/1990 | European Pat. Off.. |
| 0436111 | 11/1990 | European Pat. Off.. |
| 3821567 | 12/1989 | Germany. |
| WO8907617 | 1/1989 | WIPO. |
| WO9102764 | 8/1990 | WIPO. |

OTHER PUBLICATIONS

Mezhikovskii et al., *Chem. Abs.*, 78:98152j, 23 Apr. 1973.
English-language version of the article cited in 78:98152j, Mezhikovskii et al, "Thermal and Thermo-Oxidative Degradation of Polysulphophenylenequinones," *Vysokomol. soyed.* A14: No. 11, 2397-2404, 1972.
Trevillyan, *Chem. Abs.*, 86:139404d, 9 May 1977.
Liogon'kii et al, *Chem. Abs.*, 96:7293p, 4 Jan. 1982.
Matnishyan et al., "The Effect of Various Factors on the Synthesis of Polyarylenequinones," *Vysokomol. soyed.* A13: No. 5, 1009-1017, 1971.
Wallow et al., "Synthesis of Soluble Rigid-Chain Polymers. An Ionic Poly(p-phenylene) Analog," *Polymer Preprints*, vol. 32, No. 3, 191-192, Aug. 1991.
A. Noll et al, "Poly(phenyl-1,4-phenylene), A Temperature-resistant, Soluble, and Melt-processable Derivative of Poly(p-phenylene)," *Makromol. Chem., Rapid Commun.* 11, 485-493 (1990).
R. Matthias et al, "Soluble Poly(para-phenylene)s, 3$^{a)}$," *Makromol. Chem.*, 191, 1991-2003 (1990).
T. Maruyama et al, "Preparation and Properties of Poly-(m-ethylpyridine-2,5-diyl)s," *Chemistry Letters*, 643-646 (1992).
Sutherlin et al, "Rigid-Rod Polyquinolines with Extended Aryl., Ether Pendent Groups: An Approach to Solubility Enhancement," *Macromolecules* 18, No. 12, 2669-2675 (1985).
Mukamal et al, "Diels-Alder Polymers. III. Polymers Containing Phenylated Pheylene Units," *Journal of Polymer Science: Part A-1*, vol. 5, 2721-2729 (1967).
Wolfe et al, "Rigid-Rod Polymers. 1. Synthesis and Thermal Properties of Para-Aromatic Polymers with 2,6-Benzobisoxazole Units in the Main Chain," *Macromolecules*, 14, 909-915 (1981).

(List continued on next page.)

*Primary Examiner*—Mark L. Warzel
*Attorney, Agent, or Firm*—Christie, Parker & Hale, LLP

[57] ABSTRACT

Rigid-rod and segmented rigid-rod polymers, methods for preparing the polymers and useful articles incorporating the polymers are provided. The polymers incorporate rigid-rod backbones with pendant solubilizing groups attached thereto for rendering the polymers soluble.

20 Claims, 4 Drawing Sheets

OTHER PUBLICATIONS

Stille et al, "Diels–Alder Polymers: Polyphenylenes Containing Alternating Phenylene and Triphenylphenylene Units," J. Polym. Sci., Part B, 7, 525 (1969).

Dicke et al, "Liquid Crystal Polymers. 14. Synthesis and Properties of Thermotropic Poly(1,4–Alkylphenylene Terephthalates)," Journal of Polymer Science, 21, 8, Aug. 1983, pp. 2581–2588.

Braham et al, "Polyphenylenes vis Bis(2–pyrones) and Diethynylbenzenes. The Effect of m–and p–Phenylene Units in the Chain," Macromolecules, vol. 11, No. 2, 343, Mar.–Apr. 1978.

Chou et al, "Composites,"Scientific American, Oct. 1986, pp. 193–202.

Schilling et al, "Diels–Alders Polymerizations. VI. Phenylated Polyphenylenes from Bis–2–pyrones and p–Diethynylbenzene," Macromolecules, vol. 2, No. 1, Jan.–Feb. 1969.

Zhou et al, "Liquid Crystal Polymers. 15. Synthesis and Liquid Crystalline Properties of Alkyl–Substituted Polyesters," Journal of Polymer Science: Polymer Chemistry Edition, vol. 21, 3313–3320 (1983).

Lenz, R.W., "Structure–Order Relationships in Liquid Crystalline Polyesters," Pure and Applied Chemistry, vol. 57, No. 11, pp. 1537–1544 (1985).

Zhou et al, "Liquid Crystal Polymers. 17. Thermotropic Properties of Random Copolyesters of Monotropic and Enantiotropic Polymers," Canadian Journal of Chemistry, vol. 63, pp. 181–183, (1985).

Ballauff "Rigid Rod Polymers Having Flexible Side Chains. 1. Thermotropic Poly(1,4–phenylene2,5–dialkoxyterephthalate)s," Makromol. Chem., Rapid Commun., vol. 7, pp. 407–414 (1986).

Reck et al, "Combined Liquid–Crystalline Polymers: Rigid Rod and Semi–Flexible Main Chain Polyesters with Lateral Mesogenic Groups," Makromol. Chem., Rapid Commun., vol. 7, pp. 389–396 (1986).

Krigbaum et al, "Nematogenic Polymers Having Rigid Chains. 1. Substituted Poly(p–phenylene terephthalates)," Macromolecules, 18, 965–973 (1985).

Hwang et al, "Composites on a Molecular Level: Phase Relationships, Processing, and Properties," J. Macromolecules Sci.–Phys., B22(2), 231–257 (1983).

Hwang et al, "Solution Processing and Properties of Mulecular Composite Fibers and Films," Polymer Engineering and Science, Mid–Oct., 1983, vol. 23, No. 14, pp. 784–788.

Wellman et al, "Rodlike Polymer Reinforecment of an Amorphous Polymer Matrix AB–PBI/PBT," ACS Organic Cost. Plast. Chem., 93, 783 (1980).

Hwang et al, "Molecular Composites of Rigid Rod Poly–P–Phenylenebenzobis–thiazole (PPBT) in Thermoplastic Matrices," Organic Coatings and Applied Pol Science Proceeings, vol. 48, pp. 929–933 (1983).

Hergenrother et al, "Phenyl–Substituted Polyquinoxalines," Journal of Polymer Science: Part A–1, vol. 5, 1453–1466 (1967).

Wolfe et al, "Rigid–Rod Polymers. 2. Synthesis and Thermal Properties of Para–Aromatic Polymers with 2,6–Benzobisthiazole Units in the Main Chain," Macromolecules, 14, 915–920 (1981).

Hergenrother, P., "Polyphenylquinoxalines: Synthesis, Characterization, and Mechanical Properties," Journal of Applied Polymer Science, vol. 18, pp. 1779–1791 (1974).

Harris et al, "Soluble Aromatic Polyimides From Phenylated Dianhydrides," J. Sci., Polym. Lett. Ed., 13, 1975, pp. 283–285.

Reinhardt et al, "Pendant Oxy and Thioarylene Aromatic Heterocyclic Polymers Polym. Prepr.", (Am. Chem. Soc., Div. Polym. Chem.) 23 (2), 119 (1982).

Gordon et al, "Thermally Stable Block Copolymers: A Potential Route to Molecular Composites," Polymer Preprints, American Chemical Society, Division of Polymer Chemistry, 27: 1, 311–312 (1986).

Yamamoto et al, "A Novel Type of Polycodensation Utilizing Transition Metal–Catalyzed C—C Coupling. I. Preparation of Thermostable Polyphenylene Type Polymers," Bulletin of the Chemical Society, vol. 51, No. 7, Jul. 1978.

Lindow et al, "Pyrolysis of Biphenylene," JACS, 89, 1271 (1967).

Friedman et al, "Electron Impact and Thermal Fragmentation of Biphenylene," JACS, 90 2321 (1968).

Marvel et al, "Preparation and Aromatization of Poly–1, 3–cyclohexadine," JACS, 81 448 (1959).

Stille et al, "Poly(p–phenylene)," Macromolecules, 4, 515 (1971).

Satoh et al, "Properties of Highly Conducting Poly(p–phenylene) Film Prepared by an Electrochemical Method," Polymer Communications, 26, 396 (1985).

Ballard et al, "Biotech Route to Polyphenylene," J. Chem. Soc., Chem Commun., 954 (1983).

Jones et al, "Polymerization of Aromatic Nuclei. XXVI. Poly(p–Phenylene): Friedel–Crafts Alkylation, Molecular Weight, and Propagation Mechanism," J. Polym. Sci., Polym. Chem. Ed., 19, 89 (1981).

LeBerre et al, "Electrochemical Polymerization of Paradialkoxybenzenes. Part 1. Anodic Oxidation of Paradimethoxybenzen in Dry Acetonitrile," J. Electroanal. Chem., 218, 173 (1987).

Kirk–Othmer, Encyclopaedia of Chemical Technology, 18, 704–719 (Polyimides).

Sales Brochure entitled "Polyphenylene Precursor PPP1," Imperial Chemical Industries PLC, Runcorn Cheshire, England (4 pages).

Zembayashi et al, "Nickel Phosphine Complex–Catalyzed Homo Coupling of Aryl Halides in the Presence of Zinc Powder," Tetrahedron Letters, 4089–4092 (1977).

Rogers et al, "Highly Amorphous, Birefringent, Para–Linked Aromatic Poly–amides," Macromulecules, 18, 1058–1068 (1985).

Harris et al, "Synthesis and Characterization of Polyimides Based on 3,6–Diphenylpyromellitic Dianhydride," High Perf. Pol., 1, 3–16 (1989).

Colon et al, "Coupling of Aryl Chlorides by Nickel and Reducing Metals," J. Org. Chem., 51, 2627–2637 (1986).

Beever et al, "Synthesis and Thermal Properties of Aromatic Polymers Containing 3,6–Quinoline Units in the Main Chain," Macromolecules, 12, 1033–1038 (1979).

Stille et al, "Polyquinolines Containing Fluoroene and Anthrone Cardo Units: Synthesis and Properties," Macromolecules, 14, 486–493 (1981).

Norris et al, "Synthesis and Solution Properties of Phenylated Polyquinolines," Macromolecules, 9, 496–505 (1976).

Beever et al, "Polyquinolines: A Class of Rigid–Chain Polymers," J. Pol. Sci.: Pol. Sym., 65, 41–53 (1978).

Sybert et al, "Synthesis and Properties of Rigid–Rod Polyquinolines," Macromolecules, 14, 493–502 (1981).

Stille et al, "Polyquinolines," *Macromolecules*, 14, 870–880 (1981).

Conference Report, "Specialty Polymers" —3rd Int'l. Conference on New Polymeric Materials, Sep. 13–15, 1988.

Rehahn et al, "Soluble poly(para–phenylene)s. 1. Extension of the Yamamoto synthesis to dibromobenzenes substituted with flexible side chains," Polymer, 30, 1054–1059 (1989).

Rehahn et al, "Soluble poly(para–phenylene)s. 2. Improved synthesis of poly(para–2,5–di–n–hexylphenylene) via Pd–catalysed coupling of 4–bromo–2,5–di–n–hexylbenzeneboronic acid," *Polymer*, 30, 1060–1062 (1989).

Rehahn et al, "A High–Yield Route to 2,5–Di–n–alkyl–1,4–benzenedicarboxylic Acids," *Synthesis*, 386–388 (1988).

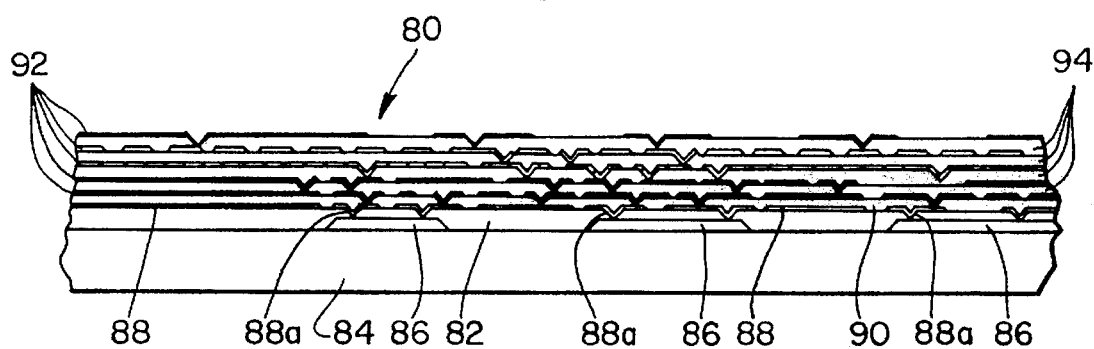
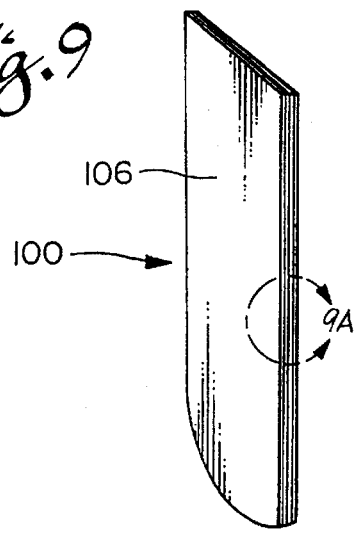
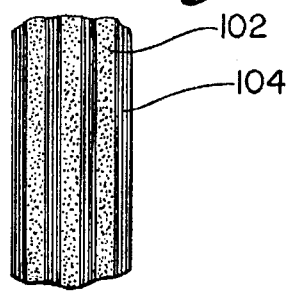

RIGID-ROD POLYMERS

RELATED APPLICATIONS

This is a continuation of application Ser. No. 07/847,351, filed Mar. 6, 1992, now abandoned, which is a continuation-in-part of U.S. application Ser. No. 07/397,732, filed Aug. 23, 1989, now U.S. Pat. No. 5,227,457, which is a continuation-in-part of U.S. application Ser. No. 07/157,451, filed Feb. 17, 1988, now abandoned. Applications Ser. Nos. 07/397,732 and 07/157,451 are incorporated herein by this reference.

FIELD OF THE INVENTION

This invention relates to soluble rigid-rod polymers having rigid-rod backbones and pendant, solubilizing organic groups attached to the backbone, and to methods for preparing the polymers. This invention also relates to copolymers comprising rigid-rod segments, having solubilizing organic groups attached to the rigid-rod segments. The rigid-rod polymers can, for example, be used as self-reinforced engineering plastics, can be used in combination with flexible coiled polymer binders for the preparation of high tensile strength molecular composites and can be used as matrix resins for fiber-containing composites.

BACKGROUND OF THE INVENTION

High-performance fiber-polymer composites are rapidly achieving a prominent role in the design and construction of military and commercial aircraft, sports and industrial equipment, and automotive components. Composites fill the need for stiffness, strength, and low weight that cannot be met by other materials. The most widely utilized high-performance fiber-polymer composites are composed of oriented carbon (graphite) fibers embedded in a suitable polymer matrix. To contribute high strength and stiffness to the composite, the fibers must have a high aspect ratio (length to width). Fibers may be chopped or continuous. The mechanical properties of chopped fiber composites improve greatly as the aspect ratio increases from 1 to about 100. Mechanical properties still improve but at a slower rate for further increases in aspect ratio. Therefore, aspect ratios of at least about 25, and preferably of at least about 100 are desirable for chopped fiber composites. Composites prepared with continuous fibers have the highest stiffness and strength. Fabricating fiber-containing composites, however, requires significant manual labor and such composites cannot be recycled. Furthermore, defective and/or damaged composite materials cannot be easily repaired.

Molecular composites are high-performance materials which are much more economical and easier to process than conventional fiber-polymer composites. In addition, molecular composites can be recycled and are repairable. Molecular composites are composed of polymeric materials only, i.e., they contain no fibers. Such molecular composites can be fabricated much more simply than fiber-polymer composites.

Molecular composites are materials composed of a rigid-rod polymer embedded in a flexible polymer matrix. The rigid-rod polymer can be thought of as the microscopic equivalent of the fiber in a fiber-polymer composite. Molecular composites with the optimum mechanical properties will contain a large fraction, at least 30 percent, of rigid-rod polymers, with the balance being polymeric binder. Molecular composites may contain either oriented or unoriented rigid-rod polymers.

A molecular composite requires that the rigid-rod polymer be effectively embedded in a flexible, possibly coil-like, matrix resin polymer. The flexible polymer serves to disperse the rigid-rod polymer, preventing bundling of the rigid-rod molecules. As in conventional fiber/resin composites, the flexible polymer in a molecular composite helps to distribute stress along the rigid-rod molecules via elastic deformation of the flexible polymer. Thus, the second, or matrix-resin, polymer must be sufficiently flexible to effectively surround the rigid-rod molecules while still being able to stretch upon stress. The flexible and rigid-rod polymers can also interact strongly via Van der Waals, hydrogen bonding, or ionic interactions. The advantages of molecular composites can only be realized with the use of rigid-rod polymers.

Most of the linear polymers produced commercially today are coil-like polymers. The chemical structure of the polymer chain allows conformational and rotational motion along the chain so that the entire chain can flex and adopt coil-like structures. This microscopic property relates directly to the macroscopic properties of flexural strength, flexural moduli, and stiffness. If fewer or less extensive conformational changes are possible, a stiffer polymer will result.

Two technical difficulties have limited molecular composites to laboratory curiosities. Firstly, the prior art relating to molecular composites calls for merely blending or mixing a rigid-rod polymer with a flexible polymer. It is well known in the art, however, that, in general, polymers of differing types do not mix. That is, homogeneous single phase blends cannot be obtained. This rule also applies to rigid-rod polymers and, thus, the early molecular composites could be made with only small weight fractions of a rigid-rod component. In these systems, an increase in the fraction of the rigid-rod component led to phase separation, at which point a molecular composite could no longer be obtained.

The second technical difficulty is that rigid-rod polymers of significant molecular weight are exceedingly difficult to prepare. The technical problem is exemplified by the rigid-rod polymer, polyparaphenylene. During the polymerization of benzene, or other monomer leading to polyparaphenylene, the growing polymer chain becomes decreasingly soluble and precipitates from solution causing the polymerization to cease. This occurs after the chain has grown to a length of only six to ten monomer units. These oligomers, i.e., rigid-rod polymers, are too short to contribute to the strength of a composite. A lack of solubility is a general property of rigid-rod polymers, hence, synthesis of all such rigid-rod polymers is difficult.

The solubility problem may be avoided in the special case in which the product polymer contains basic groups which can be protonated in strong acid and the polymerization can be conducted in strong acid. For example, rigid-rod polyquinoline can be prepared in the acidic solvent system dicresylhydrogenphosphate/m-cresol, because the quinoline group interacts with the acidic solvent, preventing precipitation. However, the resulting polymers are soluble only in strong acids, making further processing difficult.

Before molecular composites can become a practical reality, the problems of (a) blending the rigid-rod and flexible components into a stable homogeneous phase, and (b) the low solubility of the polymer, must be overcome.

SUMMARY OF THE INVENTION

In one embodiment, rigid-rod polyphenylenes provided in accordance with the present invention are linear polyphenylenes in which the polymer chain has at least about 95% 1,4 linkages, and incorporates pendant solubilizing side groups. Rigid-rod polyphenylenes may be homopolymers or copolymers having more than one type of 1,4-phenylene monomer unit. The number average degree of polymerization ($DP_n$) is greater than about 25.

As used herein, $DP_n$ is defined as follows:

$DP_n$=(number of monomer molecules present initially)/(number of polymer chains in the system)

In another embodiment of the present invention, segmented rigid-rod polyphenylene copolymers are provided. The segmented copolymers of the present invention comprise one or more rigid-rod polyphenylene segments and one or more non-rigid segments, wherein the rigid-rod polyphenylene segments have a number average segment length ($SL_n$) of greater than about eight.

As used herein, the number average segment length is defined by:

$SL_n$=(number of rigid monomer molecules present initially)/(the total number of rigid segments at the end of the reaction)

and is essentially the average number of monomer units in each rigid segment. Each polymer chain typically contains many rigid segments. However, some may contain less than others, or only one rigid segment. The number average segment length may be approximated by:

$SL_n$=(number of rigid monomer molecules present initially)/(number of kinked or flexible monomer molecules present initially+number of polymer chains at the end of the reaction)

The rigid-rod and segmented rigid-rod polymers of the present invention are unique in that they are soluble in one or more organic solvents. The polymer and the monomers demonstrate a significant degree of solubility in a common solvent system so that the polymer will remain in a dissolved state in the polymerization solvent system. The rigid-rod and segmented rigid-rod polymers of the present invention are made soluble by pendant solubilizing organic groups (side groups or side chains) which are attached to the backbone, that is, to the monomer units. The pendant organic groups impart increased solubility and meltability to the polymer by disrupting interactions between the rigid chains, providing favorable interactions with organic solvents, increasing the entropy (disorder) of the chains, and causing steric interactions which twist the phenylene units out of planarity. Therefore, such polymers can be considered to be self-reinforced plastics or single-component molecular composites. Thus, the rigid-rod and segmented rigid-rod polymers of the present invention have incorporated rod-like and coil-like components into a single molecular species. The rigid-rod or segmented rigid-rod polymer can also be mixed with a coil-like matrix resin to form a blend, wherein the pendant organic groups act as compatibilizers to inhibit phase separation.

Rigid-rod polymers produced in the past are, in general, highly insoluble (except in the special case of polymers with basic groups which may be dissolved in strong acid) and are infusible. These properties make them difficult, and often impossible, to prepare and process. We have found, surprisingly, that the incorporation of appropriate pendant organic side groups to the polymer substantially improves solubility and fusibility. Earlier work has suggested that such pendant side groups do not increase the solubility of rigid-rod polymers. However, by increasing the size of the side chain, by placing side chains so that steric repulsions prevent adjacent phenylene ring from lying in the same plane, by placing side chains in a non-regular (random) stereochemical arrangement, and/or by matching its properties (principally, polarity and dielectric constant) to the polymerization solvent, rigid-rod and segmented rigid-rod polymers of substantial molecular weight can be prepared. For example, when the polymerization is carried out in a polar solvent, such as dimethylacetamide (DMAC) or N-methylpyrrolidinone (NMP), the solubilizing organic side groups will preferably be polar and will have high dielectric constants, such as ketones, amides, esters and the like.

The rigid-rod backbone/flexible side-chain polymers of the present invention can be prepared in common solvents and can be processed with standard methods to give a stable, single-component, molecular composite or self reinforced polymer useful for structural and other applications requiring high strength and modulus.

The rigid-rod and segmented rigid-rod polymers of the present invention when used in a blend with a flexible polymer are the primary source of tensile strength and modulus of the resulting molecular composite. Such molecular composites may be homogeneous single phase blends, blends having microphase structure, or multi-phase blends having macroscopic structure. Pendant side groups can be chosen to increase compatibility between the rigid-rod or segmented rigid-rod polymer and the flexible polymer. The more compatible system will have finer phase structure. The most compatible will be miscible and homogeneous single phase. The rigid-rod and segmented rigid-rod polymers of the present invention can be blended with thermoplastics, thermosets, liquid crystalline polymers (LCP's), rubbers, elastomers, or any natural or synthetic polymeric material. It is known in the literature that the properties of chopped fiber composites improve as the aspect ratio of the fiber increases from 1 to about 100, with less relative additional improvement on further increases of aspect ratio. It is also known in the literature that in simple blends of rigid-rod and flexible polymers, the strength and moduli of the molecular composite blend is a function of the aspect ratio of the rigid-rod component, and that these blends phase separate on heating (W. F. Hwang, D. R. Wiff, C. L. Benner, and T. E. Helminiak, *Journal of Macromolecular Science—Physics, B22*, pp. 231–257 (1983)). Preferably, when employed as a self-reinforcing plastic, the rigid-rod polymer of the present invention will have an aspect ratio of at least 100, that is, the backbone of the polymer (not including side groups) will have straight segments with an average aspect ratio of at least 100. For structural and aerospace uses, for example, aspect ratios greater than 100 are desirable. For other less demanding uses, such as cabinets, housings, boat hulls, circuit boards and many others, the rigid-rod polymer backbone can have an aspect ratio of 25 or more. Similarly the segmented rigid-rod polymers of the present invention when employed in structural applications will have segments with aspect ratios greater than about 6, preferably greater than about 8.

The high strength and stiffness of the soluble rigid-rod and segmented rigid-rod polymers of the present invention are directly related to the aspect ratio of the straight segments comprising the polymer chains. For the purposes of the present invention, by aspect ratio of a monomer unit is meant the length to diameter ratio of the smallest diameter cylinder which will enclose the monomer unit, including half the length of each connecting bond, but not including any solubilizing side group(s), such that the connecting bonds are parallel to the axis of the cylinder. For example, the aspect ratio of a polyphenylene monomer unit (—$C_6H_4$—) is about 1.

The aspect ratio of a polymer segment is taken to be the length to diameter ratio of the smallest diameter cylinder which will enclose the polymer segment, including half the length of the terminal connecting bonds, but not including any attached side groups, such that the axis of the cylinder is parallel to the connecting bonds in the straight segment.

For the purposes of the present invention, aspect ratio will only be applied to rigid-rod polymers, rigid-rod monomer units, or straight segments of rigid-rod polymers. The aspect ratio of a rigid-rod polymer will be taken to mean the average aspect ratio of its straight segments. The above definition of aspect ratio is intended to provide a close analogy to its common usage with respect to fiber-containing composites.

The polymer backbone of rigid-rod polymers provided in accordance with one embodiment of this invention will be substantially straight, with no flexibility that could result in bends or kinks in the backbone, that is, they will have a high aspect ratio. Accordingly, the polymers should be made employing processes which are not prone to the formation of occasional kinks or other imperfection which may interfere with the rigidity of the backbone. Nonetheless, almost all chemical reactions have side reactions, and, accordingly, some phenylene monomer units incorporated in the final polymer will not have 1,4 linkages, but rather, will have 1,2 or 1,3 linkages (non-parallel covalent bonds). Other side reactions are also possible leading to non-phenylene linkages, for example, ether linkages or phosphorous linkages. However, the rigid-rod polymers provided in accordance with practice of the present invention will have at least 95% 1,4 linkage, and preferably, at least 99% 1,4 linkage. Any 1,2 or 1,3 linkage in the polymer chain will reduce the average length of straight segments. Thus, a polymer chain of length 1000 monomer units having 99% 1,4 linkage and will contain, on average, 11 straight segments with a number average segment length ($SL_n$) equal to approximately 91.

Rigid-rod polymers provided in accordance with this invention which have greater than 99% parallel covalent bonds, i.e., where greater than 99% of the backbone linkages are 1,4 linkages, will be exceptionally stiff and strong and will be useful where high tensile and flexural strengths and moduli are required, as in aerospace applications. Rigid-rod polymers having between about 95% and 99% parallel covalent bonds will be useful for less stringent applications, such as body panels, molded parts, electronic substrates, and a myriad others. In one embodiment of the present invention, non-rigid-rod monomer units may intentionally be introduced into the polymer, to promote solubility or to modify other properties such as $T_g$ or elongation to break.

The polymers provided in accordance with practice of the present invention can be homopolymers or can be copolymers of two or more different monomers. The polymers of the present invention comprise a rigid-rod backbone comprising at least about 25 phenylene units, preferably at least about 100 phenylene units, wherein at least about 95%, and preferably 99%, of the monomer units are coupled together via 1,4 linkages and the polymer and its monomers are soluble in a common solvent system. Solubility is provided by solubilizing groups which are attached to the rigid-rod backbone, that is, to at least some of the monomer units of the backbone. Preferably, a solubilizing group is attached to at least 1 out of 100 monomer units.

For the purposes of the present invention, the term "soluble" will mean that a solution can be prepared containing greater than 0.5% by weight of the polymer and greater than about 0.5% of the monomer(s) being used to form the polymer.

By "solubilizing groups" is meant functional groups which, when attached as side chains to the polymer in question, will render it soluble in an appropriate solvent system. It is understood that various factors must be considered in choosing a solubilizing group for a particular polymer and solvent, and that, all else being the same, a larger or higher molecular weight solubilizing group will induce a higher degree of solubility. Conversely, for smaller solubilizing groups, matching the properties of the solvent and solubilizing groups is more critical, and it may be necessary to have, in addition, other favorable interactions inherent in the structure of the polymer to aid in solubilization.

By the term "rigid-rod monomer unit" it is meant the basic, organic, structural units of the polymer rigid-rod backbone chain in which the covalent bonds connecting them to adjacent monomer units are parallel regardless of conformational changes within the rigid-rod monomer unit. For the purposes of this invention rigid-rod monomer units will be limited to 1,4-phenylene units, including any attached side chain, i.e., solubilizing groups.

The term "monomer unit" will always be used in the present invention to mean "rigid-rod monomer unit." In the instances where a flexible or non-rigid-rod monomer unit is discussed, it will be indicated as a "non-rigid monomer unit." Most non-rigid monomer units cannot attain a conformation in which the bonds to the polymer chain are parallel, for example, the 1,3-phenylene group or the 4,4'-diphenylether group. However, some non-rigid monomer units will admit a conformation in which the bonds to the polymer chain are parallel, such as the phenylene amide type non-rigid monomer units of a polymer provided by DuPont Company under the trademark KEVLAR (polyamide of 1,4-phenylenediamine and terephthalic acid). Polymers comprised of such non-rigid monomer units are "pseudo-rigid" due to the possibility of bent or kinked conformations. Rigid-rod polymers are, in general, stiffer than pseudo-rigid polymers.

By the term "monomers," for the purposes of the present invention, it is meant the immediate chemical precursors to the polymer. Because most of the polymerization reactions described herein are condensation polymerizations, a monomer will typically lose one or more functional group(s) with respect to the corresponding monomer unit. For example, the monomer dichlorobenzene ($C_6H_4Cl_2$) polymerizes to a polymer with phenylene ($C_6H_4$) monomer units.

The solubility of rigid-rod and segmented rigid-rod polymers provided in accordance with this invention is achieved by the attachment of pendant, solubilizing organic groups to at least some of the monomer units of the polymers. One who is skilled in the art will recognize that it is difficult to determine a priori what combinations of organic substituent (pendant organic group), polymer backbone, polymer configuration, solvent system, and other environmental factors (e.g., temperature, pressure) will lead to solubility due to the many complex interactions involved. Indeed, as is mentioned above, other workers have found that pendant organic side groups do not provide a substantial increase in the solubility of rigid-rod oligomers and polymers. We, however, have discovered general strategies for the rational design of soluble rigid-rod and segmented rigid-rod polymer systems. For example, if the rigid-rod or segmented rigid-rod polymers are to be synthesized in polar solvents, the pendant solubilizing organic groups of the polymer and the monomer starting material will be a group that is soluble in polar solvents. Similarly, if the rigid-rod or segmented rigid-rod polymers are to be synthesized in non-polar solvents, the pendant solubilizing organic group on the rigid-rod polymer backbone and the monomer starting material will be a group that is soluble in non-polar solvents.

Various factors dependent on the nature of the backbone itself also affect the inherent solubility of the polymer. The orientation of the individual monomer units, especially with regard to the positioning of pendant organic substituents, has been shown to have an effect on the solubility properties of polymers. In particular, 2,2'-disubstituted biphenylene units incorporated into aromatic polyesters (H. G. Rogers et al, U.S. Pat. No. 4,433,132; Feb. 21, 1984), rod-like polyamides (H. G. Rogers et al, *Macromolecules* 1985, 18, 1058) and rigid polyimides (F. W. Harris et al, *High Performance Polymers* 1989, 1, 3) generally lead to enhanced solubility, presumably not due to the identity of the substituents themselves but to sterically enforced non-coplanarity of the biphenylene aromatic rings. Extended, planar chains and networks of conjugated aromatics exhibit good stacking and strong intermolecular interactions and are generally expected to exhibit high crystallinity and, thus, poor solubility. Random distribution of side chains in homopolymers and especially copolymers will enhance solubility by lowering the symmetry of the polymer chain, thereby decreasing crystallinity.

The rigid-rod and segmented rigid-rod polymers (homopolymers and copolymers) provided in accordance with the present invention will have at least one monomer unit for each 100 monomer units in the rigid-rod backbone substituted with a solubilizing organic group, or preferably one monomer unit for each ten monomer units in the rigid-rod backbone substituted with a solubilizing organic group. In general, for relatively small solubilizing side groups a higher degree of substitution is needed for good solubility. In many instances no more than 50% of the monomer units should be unsubstituted, for example copolymers of 1,4-dichlorobenzene and 2,5-dichlorobenzophenone show appreciable decrease in solubility with 10% unsubstituted units, and only low MW material can be prepared at greater than about 50% unsubstituted units. The solubilizing organic groups which are substituted on, attached to, or pendant to the monomer units are organic molecules that have solubility in one or more organic solvent system(s). In order that relatively small organic groups, that is, those of a molecular weight of less than about 300, are capable of providing appropriate solubility, other favorable backbone interactions, as described above, may be required. For instance, at least one 2,2'-disubstituted biphenylene fragment would be required in the backbone for each 200 monomer units, and preferably for each 20 monomer units, and more preferably for each four monomer units in a polyparaphenylene type polymer. In embodiments of the invention, where the rigid-rod polymer is a homopolymer, the same organic or pendant group(s) occur(s) on each monomer unit. The side chains are chosen to enhance solubility, especially in the polymerization solvent system. For example, polar groups, such as N,N-dimethylamido groups, will enhance solubility in polar solvents.

In one embodiment of the invention, the polymer is a copolymer of two or more rigid monomer unit types, and the majority of monomer units are substituted with solubilizing organic groups. The polymer can be formed from two different monomer units or monomers, three different monomer units or monomers, four different monomer units or monomers, and so on. At least one out of every 100 (1%), preferably 10% and more preferably 50% of the monomer units in the rigid-rod backbone has a solubilizing organic group attached to it.

In another embodiment of the invention, the polymer is a copolymer having rigid-rod segments with segment length ($SL_N$) of at least about eight, and non-rigid segments of any length. In the case where rigid-rod segments are separated by only a single non-parallel linkage, the non-parallel linkages represent kinks in an otherwise straight polymer molecule, as for example would be introduced with isolated 4,4'-diphenyl ether monomer units. In this case the angle between the rigid-rod segments is fixed. If the non-rigid monomer units have more than one non-parallel linkage, or if the non-rigid segments have length greater than one, the angle between the rigid-rod segments is not fixed, and the copolymer as a whole has much greater flexibility. In the case of long non-rigid blocks the copolymer may be considered a single component molecular composite, where the rigid blocks reinforce the flexible blocks.

Where rigid-rod polyphenylene segments are used in a block copolymer with non-rigid segments, the rigid segments will have a dramatic effect on the physical and mechanical properties of the copolymer for relatively small aspect ratio of the rigid segments.

BRIEF DESCRIPTION OF THE DRAWINGS

These and other features, aspects and advantages of the present invention will be more fully understood when considered with respect to the following detailed description, appended claims, and a accompanying drawings, wherein:

FIG. 8 is a semi-schematic fragmentary cross-sectional side view of a multi-chip module provided in accordance with practice of the present invention.

FIG. 9 is a semi-schematic side view of a fiber containing composite comprising a polymer provided in accordance with the present invention.

FIG. 9A is an enlarged view of a portion of the edge of the fiber-containing composite of FIG. 9.

DETAILED DESCRIPTION OF THE INVENTION

Figure 1:
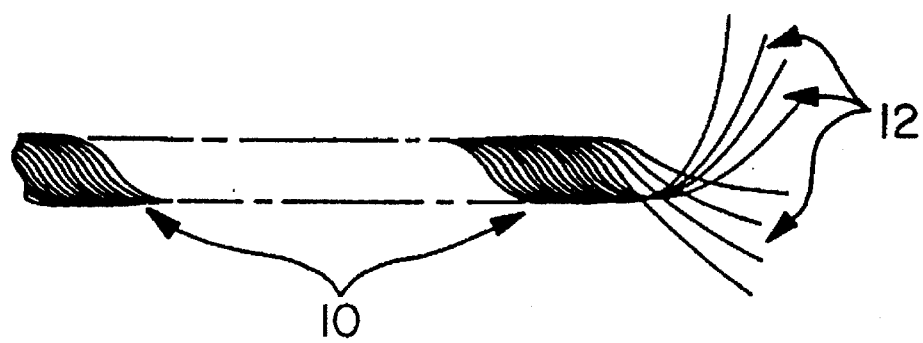
FIG. 1 is a semi-schematic perspective view of a multifilament fiber provided in accordance with practice of the present invention.

In a first preferred embodiment, the rigid-rod polymers provided in accordance with practice of the present invention are linear polyphenylenes which incorporate parallel covalent bonds (1,4 linkages) between monomer units. Such rigid-rod polymers will have at least 95% 1,4 linkages, and preferably at least 99% 1,4 linkages, i.e., the polymers will have high aspect ratios.

The rigid-rod polymers of the present invention have the following general structure:

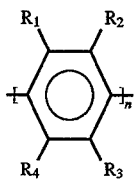

Structure I wherein each $R_1$, $R_2$, $R_3$, and $R_4$ are independently chosen solubilizing groups or hydrogen. The structure is meant to represent polymers having mixtures of monomer units as well as those having a single type of monomer unit. The structure does not imply any particular orientation, order, stereochemistry, or regiochemistry of R groups. Thus, the polymer may have head-to-head, head-to-tail, random, block or more complicated order. The particular order will depend on the method of preparation and the reactivity and type of monomers used.

In another preferred embodiment of the present invention, rigid polyphenylene segments are separated by flexible monomer units or flexible segments or blocks to give a segmented rigid-rod polymer. In this case the flexible segments contribute to solubility and processability as well as the solubilizing side groups on the rigid polyphenylene segments. The rigid backbone of the rigid segments provide the segmented rigid-rod polymer with a high degree of stiffness and strength, and also modify other properties, such as creep resistance, flammability, coefficient of thermal expansion, and the like, to a degree proportional to the relative amounts of rigid and flexible segments. In fact, such physical and mechanical properties can be precisely adjusted by adjusting the rigid fraction. For example, the coefficient of thermal expansion of a segmented rigid-rod polymer may be adjusted to match a particular material by controlling the amount of rigid monomer relative to flexible monomer used in its preparation.

Dihaloaromatic monomers of Structure II may be used in the preparation of segmented rigid-rod polymers.

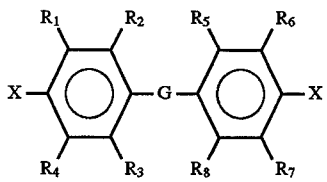

Structure II where $R_1$–$R_8$ are independently chosen from solubilizing side groups and H wherein G is —O—, —S—, —CH$_2$—, —CY$_2$—, —OCH$_2$—, —OAr—, —O(ArO)$_n$—, —(CH$_2$)$_n$—, —(CY$_2$)$_n$—, —CO—, —CO$_2$—, —CONY—, —O(CH$_2$CH$_2$O)$_n$—, —(CF$_2$)$_n$—, —COArCO—, —CO(CH$_2$)$_n$CO—, —C(CF$_3$)$_2$—, —C(CF$_3$)(Y)—, —NY—, —P(=O)Y—, X is Cl, or Br, or I and Ar is an aromatic group, heteroaromatic group, or substituted aromatic group, and Y is independently selected from the group consisting of H, F, CF$_3$, alkyl, aryl, heteroaryl, or aralkyl group, and n is 1 or greater.

In order to provide significant improvement in physical and mechanical properties over flexible polymers the segmented rigid-rod polymers of the present invention should have rigid segments with number average segment length ($SL_n$) of at least about 8.

One such exemplary embodiment of the structure of a polymer comprising rigid-rod polyphenylene segments separated by flexible monomer units (the segmented rigid-rod polymer of the present invention) is as follows:

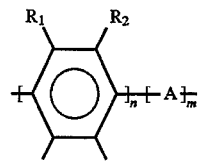

Structure III wherein:

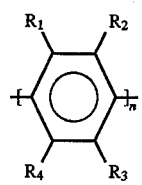

is a rigid-rod polymer segment, wherein each $R_1$, $R_2$, $R_3$ and $R_4$ on each monomer unit, independently, is H or a solubilizing side group, and —[A]$_m$— is a non-rigid segment, for example as derived from non-rigid monomers of Structure II; wherein the rigid-rod polyphenylene segments have number average segment length $SL_n$ of at least about 8, n is the average number of monomer units in the rigid segment, m is the average number of monomer units in the flexible segment and m is at least 1.

In one exemplary embodiment, the segmented rigid-rod polymer of the present invention has structure III wherein —A— is:

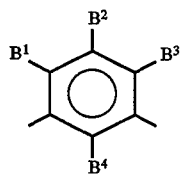

wherein $B^1$–$B^4$ are independently selected from the group consisting of H, $C_1$ to $C_{22}$ alkyl, $C_6$ to $C_{20}$Ar, alkaryl, F, CF$_3$, phenoxy, —COAr, —COalkyl, —CO$_2$Ar, —CO$_2$alkyl, wherein Ar is aryl or heteroaryl. The flexible monomer units in this case may be derived from substituted 1,3-dichloroarenes. In another exemplary embodiment —A— is 1,3-phenylene and is derived from 1,3-dichlorobenzene. Other flexible monomers and monomer units may be used as are apparent to one skilled in the art.

The segmented rigid-rod polymers may be used in the same ways as the rigid-rod polymers including compression and injection molding, extrusion, to prepare films and fibers, in blends, alloys and mixtures, as additives, as matrix resins, and in other ways apparent to those skilled in the art.

Other polymer systems have been described in the past as rigid or rod-like but must not be confused with true rigid-rod polymers provided in accordance with this invention. For instance, long chain para-oriented aromatic polyamides and polyesters often exhibit ordering, due to various intermolecular forces, into rod-like assemblies and consequently demonstrate some of the advantages (e.g., high strength) and disadvantages (poor solubility) of true rigid-rod polymers. Such polymer systems are actually only "pseudo-rigid" because ester and amide linkages are not inherently rigid or parallel and only adopt parallel configurations under certain conditions. At lower concentrations or higher temperature they may behave like flexible polymers. It is known in the art that the theoretical stiffness of aromatic polyamide and polyester backbones is lower than a polyphenylene backbone. Stiffer polymers will of course have greater reinforcing properties.

The rigid-rod and segmented rigid-rod polymers of the present invention will have at least one monomer unit for each 100 monomer units in the rigid-rod backbone substituted with a solubilizing organic group. Preferably, the polymer will have at least about one monomer unit in ten substituted with solubilizing organic groups. More preferably, the polymer will have more than one monomer unit per 10 monomer units substituted with solubilizing organic groups. The solubilizing organic groups which are substituted on, attached to, or pendant to, the monomer units are organic molecules that have solubility in one or more organic solvent system(s). Solubilizing organic groups which can be used include, but are not limited to, alkyl, aryl, alkaryl, aralkyl, alkyl or aryl amide, alkyl or aryl thioether, alkyl or aryl ketone, alkoxy, aryloxy, benzoyl, phenoxybenzoyl, sulfones, esters, imides, imines, alcohols, amines, and aldehydes. Other organic groups providing solubility in particular solvents can also be used as solubilizing organic groups.

In an exemplary embodiment, a polymer of Structure I or III is provided where at least one of the R groups is:

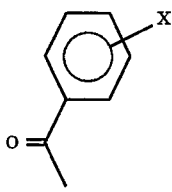

wherein X is selected from the group consisting of hydrogen, amino, methylamino, dimethylamino, methyl, phenyl, benzyl, benzoyl, hydroxy, methoxy, phenoxy, —$SC_6H_5$, and —$OCOCH_3$.

In another exemplary embodiment, a polymer of Structure I or III is provided where at least one of the R groups is:

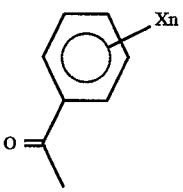

and wherein X is selected from the group consisting of methyl, ethyl, phenyl, benzyl, F, and $CF_3$, and n is 1, 2, 3, 4, or 5.

In another exemplary embodiment, a polymer of Structure I or III is provided wherein one of $R_1$, $R_2$, $R_3$ or $R_4$ is selected from the group consisting of —$CR_5R_6Ar$ where Ar is aryl, $R_5$ and $R_6$ are H, methyl, F, C1 to C20 alkoxy, OH, and $R_5$ and $R_6$ taken together as bridging groups —$OCH_2CH_2O$—, —$OCH_2CH(CH_2OH)O$—, —$OC_6H_4O$— (catechol), —$OC_6H_{10}O$— (1,2-cyclohexanediol), and —$OCH_2CHR_7O$— where $R_7$ is alkyl or aryl.

In yet another exemplary embodiment, a polymer of Structure I or III is provided wherein $R_1$ is —(CO)X where X is selected from the group consisting of 2-pyridyl, 3-pyridyl, 4-pyridyl, —$CH_2C_6H_5$, —$CH_2CH_2C_6H_5$, 1-naphthyl and 2-naphthyl or other aromatic, fused ring aromatic or heteroaromatic group.

In an additional exemplary embodiment, a polymer of Structure I or III is provided wherein at least one of the R groups is —$SO_2X$ and wherein X is selected from the group consisting of phenyl, tolyl, 1-naphthyl, 2-naphthyl, methoxyphenyl, and phenoxyphenyl or other aromatic or substituted aromatic groups.

In a further exemplary embodiment, a polymer of Structure I or III is provided wherein at least one of the R groups is —$NR_5R_6$ and wherein $R_5$ and $R_6$ may be the same or different and are independently chosen from the group consisting of alkyl, aryl, alkaryl, hydrogen, methyl, ethyl, phenyl, —$COCH_3$ and $R_5$ and $R_6$ taken together as bridging groups —$CH_2CH_2OCH_2CH_2$—, —$CH_2CH_2CH_2CH_2CH_2$—, and —$CH_2CH_2CH_2CH_2$— and the like.

In another exemplary embodiment, a polymer of Structure I or III is provided wherein at least one of the R groups is —$N$=$CR_5R_6$ and $R_5$ and $R_6$ may be the same or different and are independently selected from the group consisting of alkyl, aryl, alkaryl, —H, —$CH_3$, —$CH_2CH_3$, phenyl, tolyl, methoxyphenyl, benzyl, aryl, C1 to C22 alkyl, and $R_5$ and $R_6$ taken together as bridging groups —$CH_2CH_2OCH_2CH_2$—, —$CH_2CH_2CH_2CH_2CH_2$—, and —$CH_2CH_2CH_2CH_2$— and the like.

The rigid-rod and segmented rigid-rod polymers of the present invention are made in accordance with well-known chemical polymerization and addition reactions or by novel processes described herein. Such processes for preparation of the rigid-rod and segmented rigid-rod polymers of the present invention employ chemical polymerization addition reactions in solvent systems in which the rigid-rod and segmented rigid-rod polymers and the monomer starting materials are both soluble. Of course, the monomer and polymer will not demonstrate complete solubility under all conditions. The polymer will likely demonstrate solubility only up to a certain weight fraction, depending on the exact solvent-polymer pair and other factors, such as temperature. Obviously, it is not necessary for the monomer to be completely soluble in a solvent for a chemical reaction to proceed. As is well known in the art, compounds demonstrating limited solubility in a chemical mixture will completely react to give product due to the equilibrium between dissolved and undissolved monomer, that is, undissolved monomer will slowly undergo dissolution as that fraction of dissolved monomer is continuously exhausted in the reaction. As is discussed above, the monomer and polymer are considered "soluble" in a particular solvent system when a solution can be prepared which contains at least about 0.5% by weight monomer and at least about 0.5% by weight polymer.

In order to assure solubility of the monomer and polymer in the solvent, the properties of the appended organic groups must be matched to those of the desired solvent. Thus, if the rigid-rod and segmented rigid-rod polymers are to be synthesized in polar solvents, the pendant solubilizing organic groups of the polymer and the monomer starting material will be groups that are soluble in polar solvents. Similarly, if the rigid-rod and segmented rigid-rod polymers are to be synthesized in non-polar solvents, the pendant solubilizing organic group on the rigid-rod and segmented rigid-rod polymer and the monomer starting material will be a group that is soluble in non-polar solvents. We have found that it is very important to match the dielectric constant and dipole moment of the solubilizing organic groups to that of the solvent to achieve solubilization. For instance, to achieve solubility in polar aprotic solvents such as NMP, the solubilizing organic groups should have dielectric constants greater than about 5 and dipole moments greater than about 1.5.

In general, relatively long organic side chains, e.g. those with a molecular weight of greater than about 300, are preferred to enhance solubility of the rigid-rod polymers of the present invention. Surprisingly, however, we have found that rigid-rod polyphenylene type polymers, that is, rigid-rod polymers comprised of linear polyparaphenylene type monomer units having Structure I can be solubilized with relatively short organic groups appended, e.g., organic groups with molecular weights from about 15 to about 300. Solubility is typically achieved by a combination of favorable interactions acting together. For instance, solubility can be achieved in rigid-rod polyparaphenylenes substituted with the very small (i.e., low molecular weight) but very polar side chains hydroxy (—OH) and amino (—NH$_2$).

Planar aromatics tend to stack well, causing them to be very crystalline and, thus, have low solubility. This tendency to stack can be reduced by forcing adjacent aromatic rings, e.g., monomer units, to twist away from planarity. This can be effected by the addition of substituents next to the covalent bonds linking the monomer units, leading to significant numbers of disubstituted 2,2'-biaryl type linkages. Such units have been shown to increase solubility when incorporated into other types of polymer systems. Therefore, to achieve maximum solubility of short chain appended polyparaphenylenes, either the nature of the monomer units or of the polymerization should be such that significant numbers of disubstituted 2,2'-biphenyl linkages are introduced into the polymer. For example, if every monomer unit has a single non-hydrogen side group ($R_1 \ne H$, $R_2 = R_3 = R_4 = H$), then a regular head-to-tail catenation will lead to no 2,2'-disubstituted linkages, however, a regular head-to-head catenation will lead to 50% of the linkages having 2,2'-disubstitution and 50% 2,2'-unsubstituted. A perfectly random catenation will give 25% 2,2'-unsubstituted, 50% 2,2'-monosubstituted and 25% 2,2'-disubstituted linkages.

We have found, in particular, that rigid-rod polyphenylenes having benzoyl or substituted benzoyl solubilizing side groups are soluble in amide solvents, for example N-methylpyrrolidinone (NMP), and high MW rigid-rod polyphenylenes can be prepared in amide solvents. Poly-1, 4-(benzoylphenylene), 1, may be prepared from 2,5-dichlorobenzophenone by reductive coupling with a nickel catalyst. The resulting polymer dopes have very high viscosities and may be purified by precipitation into ethanol or other non-solvents. The dried polymer is soluble in NMP, dimethylacetamide, phenylether, m-cresol, sulfuric acid, anisole, 5% NMP in chloroform, chlorobenzene, and similar solvents.

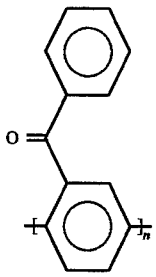

Poly-1,4-(benzoylphenylene), 1

The molecular weight of polymer 1 will depend on the exact conditions of polymerization, including monomer to catalyst ratio, purity of the reactants and solvent, dryness of solvent, oxygen concentration, and the like. The method by which the zinc is activated greatly influences the molecular weight. It appears that the highest MW is obtained when the zinc is most active, that is when the reaction time is shortest. It is important that the zinc be free flowing powder which does not contain clumps which may form in the drying steps. The method of zinc activation given in the examples below is effective and convenient, however, other methods of activation are suitable including sonication, distillation, and treatment with other acids followed by rinsing and drying. It is also important that the zinc be well mixed during, and especially at the beginning of, the reaction.

Molecular weight may be measured by many methods, most of which give only a relative molecular weight. Two of the most widely used methods are viscosity and gel permeation chromatography (GPC). The intrinsic viscosity, [η], may be related to the molecular weight by the Mark-Houwink Equation:

$$[\eta] = k \cdot MW^\alpha$$

For flexible polymers α is typically about 0.6, however, for rigid polymers α is usually greater than 1 and may be as high as 2. In order to determine absolute molecular weight, k and α must be obtained from other methods, or estimated using standards having structure similar to the polymer under study. Since there are no known rigid-rod polymers soluble in organic solvents there are no good standards for the polyphenylenes described here. We can make a crude estimate based on the expected relationship between viscosity and molecular weight for rigid-rods as has been applied to polyparabenzobisthiazole and polyparabenzobisoxazole {J. F. Wolfe "Polybenzothiazoles and Oxazoles." in *Encyclopedia of Polymer Science and Engineering*; John Wiley & Sons, Inc., New York, 1988; Vol. 11, pp. 601–635.}:

$$[\eta] = 4.86 \times 10^{20} (d_h^{0.2}/M_l)(M_\eta/M_l)^{1.8}$$

where [η] is in dL/g, $d_h$ is the hydrodynamic diameter of a chain element in cm, and $M_l$ is the mass-per-unit length in g/cm. If $d_h$ is taken to be $10^{-7}$ cm (1 nm), the $M_l$ of trans-PBT is $2.15 \times 10^9$ cm$^{-1}$, the $M_l$ of cis-PBO is $1.83 \times 10^9$ cm$^{-1}$, $M_\eta = M_w(M_z/M_w)^{4/9}$, and $M_z/M_w = 1.3$ then the, weight-average molecular weight can be determined from the simple measurement of [η].

For polymer 1 we estimate $d_h \approx 1.5 \times 10^{-7}$ cm; $M_l = 4.19 \times 10^9$ cm$^{-1}$=MW/l=180/4.3Å; and [η]=$2.4 \times 10^{-8} \cdot MW^{1.8}$. Thus the polymer of Example 1 below has [η]=7.2 dL/g and an estimated viscosity average MW of 51,000.

Intrinsic viscosity is useful as a relative measure of molecular weight even without Mark-Houwink constants. For comparison the highest reported viscosity for a polyphenylene is 2.05 dL/g {M. Rehahn, A.-D. Schlüter, G. Wegner *Makromol. Chem.* 1990, 191, 1991–2003}.

Similarly, molecular weights as determined by GPC require a calibration standard, and no rigid-rod standards are available. The GPC data given in the examples below are reported using a polystyrene standard and are therefore expected to be much higher than the actual weight average molecular weights.

The soluble rigid-rod polymers of the present invention can be made by any method which is highly selective for 1,4-phenylene regiochemistry. Non-limiting examples of such reactions are: nickel catalyzed coupling of 4-chloroaryl Grignard reagents, nickel or palladium catalyzed coupling of 1,4-arylhalides, palladium catalyzed coupling of 4-chlorophenylboronic acids, Diels-Alder coupling of monosubstituted 2-pyrones (J. N. Braham, T. Hodgins, T. Katto, R. T. Kohl, and J. K. Stille, *Macromolecules*, 11, 343–346, 1978.), anodic oxidation of 1,4-dialkoxybenzene, and addition polymerization of cyclohexadienediol derivatives. The polymer will be at least 25 monomer units in length, preferably at least 100 monomer units in length, and, most preferably, longer than 100 monomer units. The polymer can be a homopolymer of a single monomer or a copolymer of two or more different monomers or monomer units. The segmented rigid-rod polymers of the present invention can be made using the same methods as for the rigid-rod polymers, except that a non-rigid-rod monomer is added to the rigid-rod monomers before or during polymerization.

Processes for preparing unsubstituted or alkyl substituted polyphenylenes from aryl Grignard reagents are described in T. Yamamoto et al, *Bull. Chem. Soc. Jpn.*, 1978, 51, 2091 and M. Rehahn et al, *Polymer*, 1989, 30, 1054. Paraphenylene polymers (made up of monomer units of Structure I) can be prepared by the coupling of Grignard reagents of paradihalobenzenes catalyzed by transition metal complexes. Thus, a mixture of 4-bromophenylmagnesium bromide (1 mole) and 4-bromo-3-alkylphenylmagnesium bromide (1 mole), the alkyl group having an average chain length of about 24 carbon atoms, will react in an ether solvent in the presence of a transition metal complex to yield a polyparaphenylene rigid-rod polymer having about one out of two monomer units substituted with a long chain alkyl group. The transition metal-catalyzed coupling reaction proceeds selectively and quantitatively under mild conditions. In another variant of the reaction, 1,4-dibromobenzene (0.5 mole) and a 1,4-dibromobenzene substituted with a long-chain alkoxy group (1 mole) can be coupled in the presence of magnesium metal and a transition metal catalyst in an inert solvent, such as ether, to produce a polyparaphenylene rigid-rod polymer having on the average about two monomer units out of three monomer units substituted with a long-chain alkoxy group. A variety of dihalogenated benzenes (monomers of Formula IA), biphenyls (monomers of Formula IB), terphenyls (monomers of Formula IC), can be polymerized using these methods ($R_1$–$R_{12}$ of monomers IA, IB and IC are independently chosen from solubilizing groups and H). Dibromo-substituted compounds (X=Br) are the compounds of choice for the reaction; however, in many instances, the dichloro compound (X=Cl) can also be used, if the reaction can be initiated. We have found that the $NiCl_2$ (2,2'-bipyridine) transition metal catalyst works satisfactorily for this reaction.

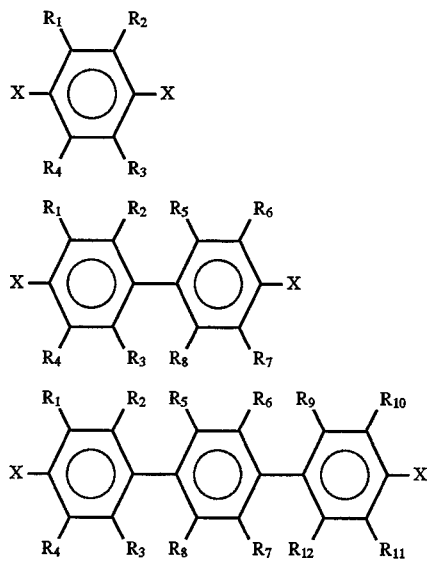

When the rigid-rod or segmented rigid-rod polymers are prepared under Grignard conditions, the following types of organic groups may react with the Grignard reagents, causing undesirable side reactions: alkyl halides, amides, esters, ketones, and the like. Thus, such groups should be avoided as solubilizing side groups when the polymers of the present invention are prepared using Grignard conditions.

Coupling of the paradihaloarene monomers is preferably carried out with nickel or palladium catalysts with zinc as the reducing agent. We have discovered that such polymerizations give soluble rigid-rod polyparaphenylene polymers with high molecular weights in virtually quantitative yields. This approach has distinct advantages, since a wider variety of solvents can be employed, such as N,N-dimethylformamide (DMF), N-methylpyrrolidinone (NMP), hexamethylphosphoric triamide (HMPA), benzene, tetrahydrofuran (THF), and dimethoxyethane (DME). This coupling reaction can also be used with monomers having specially reactive groups, such as nitrile and carbonyl groups. In addition, zinc is less expensive and easier to handle than magnesium. Similar reactions to prepare biphenyl derivatives and non-rigid polymer systems have been demonstrated by Colon (I. Colon and D. Kelsey, *J. Org. Chem.*, 1986, 51, 2627; I. Colon and C. N. Merriam, U.S. Pat. No. 4,486,576, Dec. 4, 1984). Unfortunately, this technique was demonstrated to be unsatisfactory to produce high molecular weight polymers from substituted dihalobenzene type monomers due to deactivation of the nickel catalyst by the substituents.

It was, therefore, unexpected when we discovered that certain mixtures of anhydrous nickel compounds, triarylphosphine ligands, inorganic salt promoters, and zinc metal were efficient for the preparation of high molecular weight polyparaphenylenes from the reductive coupling of paradihalobenzene monomer units substituted with solubilizing organic groups in anhydrous polar aprotic solvents. It is highly recommended to utilize highly purified (preferably greater than about 99% pure) paradihalobenzene monomer from which any water or other aprotic impurities have been removed. For instance, a mixture of one equivalent of anhydrous nickel chloride, three equivalents of sodium iodide, seven equivalents of triphenylphosphine, and 50 equivalents of zinc metal is effective in the polymerization of about 30 equivalents of substituted paradichlorobenzene monomer. The polymerization reaction is preferably carried out at about 50° C. but is effective from about 25° C. to about 100° C. The ratio of equivalents of monomer to equivalents of nickel catalyst can vary over the range from about 10 to about 5000, and the ratio of equivalents of zinc to equivalents of monomer is at least 1.0. The ratio of equivalents of phosphine ligands to equivalents of nickel catalyst varies from about 3.0 to about 10 or more. The concentration of phosphine ligands should be about 2.5M or more to prevent the formation of highly unsaturated nickel zero complexes which lead to undesired side reactions. Use of inorganic salt promoters is optional. When used, the inorganic salt promoter should be at a concentration of about 0.05M to 1M, preferably about 0.1M. Non-limiting examples of inorganic salt promoters are alkali iodides, alkali bromides, zinc halides and the like. These promoters reduce or eliminate the induction period which is typical of nickel catalyzed couplings of aryl halides. When rigid-rod or segmented rigid-rod polymers are prepared by nickel catalyzed coupling, the following types of side groups may interfere with the reaction and should be avoided: halides, acids, alcohols, primary and secondary amines, nitro groups, and any protic groups. If side groups of these types are desired they should be introduced in protected form.

When using the nickel-triarylphosphine catalyst described above, one must be careful to select sufficiently reactive monomers in order to obtain high molecular weight polyparaphenylenes. If the reactivity is too low, we believe that side reactions are more likely to occur, which can limit molecular weight and/or deactivate the catalyst. Also, the two halide groups of the paradihaloarene monomers may have different reactivities, depending on the identity and location of the substituent groups. Therefore, the orientation (e.g. head-to-head, head-to-tail, and tail-to-tail) of the monomer groups along the polymer backbone will be largely determined by the relative reactivities of the halo groups of the monomer. Relative reactivities are also important to consider when copolymers are being prepared. For instance, it is desirable to choose comonomers of similar reactivities when a completely random distribution of the different monomer groups is desired in the copolymer. Conversely, it may be desirable to choose monomers with significantly different reactivities in order to obtain block-type copolymers, although molecular weight may be limited if the reactivity of any of the monomers is too low.

In general, it is desirable to have some knowledge of the reactivity of monomers or comonomers in order to make some predictions about the quality, structure, or properties of the resulting polymers or copolymers. For instance, we have utilized a simple semi-quantitative procedure (see Example 29) for determining the relative coupling reactivities of various monohaloarene model compounds using nickel-triarylphosphine catalysts. The results of such experiments can then be used to estimate the relative reactivities of corresponding paradihaloarene monomers or comonomers. In general, we have found that to obtain the highest molecular weights, monomers must be chosen such that high conversions are achieved within about 4–6 hours when carried out under the preferred reaction conditions described above.

For instance, if it is desired to prepare the corresponding polyparaphenylene from the reductive coupling of 2,5-dichlorobenzoylmorpholine, one would consider the relative reactivities of 3-chlorobenzoylmorpholine (fast) and of 2-chlorobenzoylmorpholine (slow) and would expect a head-to-head and tail-to-tail orientation and that molecular weight might be somewhat limited. Similarly, if one wanted to prepare a copolymer comprising paradichlorobenzene and 2,5-dichlorobenzophenone comonomers, then the relative reactivities of chlorobenzene, 2-chlorobenzophenone, and 3-chlorobenzophenone should be considered (e.g. from Example 29, we see that the reactivities are similar, and fast, so a random copolymer with high molecular weight would be expected).

Aryl group coupling to afford polyphenylenes has also been effected by the palladium catalyzed condensation of haloaryl boronic acids as reported by Y. H. Kim et al, *Polymer Preprints*, 1988, 29, 310 and M. Rehahn et al, *Polymer*, 1989, 30, 1060. The para-haloaryl boronic acid monomers required for formation of polyparaphenylenes can be prepared by the monolithiation of the paradihalobenzene with butyl lithium at low temperature and subsequent trimethylborate quench and aqueous acid workup. These polymerizations are carried out in aromatic and ethereal solvents in the presence of a base such as sodium carbonate. Therefore, this type of reaction is suitable for producing polyparaphenylenes substituted with organic groups such as alkyl, aryl, aralkyl, alkaryl, polyfluoroalkyl, alkoxy, polyfluoroalkoxy, and the like.

The choice of solvents for the various polymerization or condensation reactions will be somewhat dependent on the reaction type and the type of solubilizing organic groups appended to the monomers. For the condensation of aryl monomers employing Grignard reagents with transition metal catalysts, the solvents of choice are ethers, and the best solubilizing side chains are ethers, such as phenoxyphenyl, and long-chain alkyls. Anodic polymerization is done in acetonitrile-type solvents, and ethers and aromatic side chains, such as phenylether, and benzyl would be the favored side chains.

The monomer units are known or can be prepared by conventional chemical reactions from known starting materials. For example, the 1,4-dichlorobenzophenone derivatives can be prepared from 2,5-dichlorobenzoic acid via 2,5-dichlorobenzoyl chloride followed by Friedel Crafts condensation with an aromatic compound, for example benzene, toluene, diphenylether and the like. The paradihalobenzene monomers substituted at the 2 position with an alkoxy group can be prepared from the corresponding 2,5-dihalophenol by allowing the phenol in the presence of sodium hydroxide and benzyltriethylammonium chloride to react with the corresponding 1-haloalkyl, such as benzyl bromide. Substituted dichlorobenzenes may also be prepared from the inexpensive 2,5-dichloroaniline by diazotization of the amine groups to yield corresponding p-dichlorobenzenediazonium salt. The diazonium salt is treated with nucleophiles in the presence of copper salts to form the desired product.

In addition to being soluble in organic solvents, surprisingly, the polymers of the present invention may be thermally processed, for example, by compression molding or by injection molding. For example, injection molded specimens of poly-1,4-(4'-phenoxybenzoylphenylene), have flexural moduli greater than 1 million pounds per square inch (MSI).

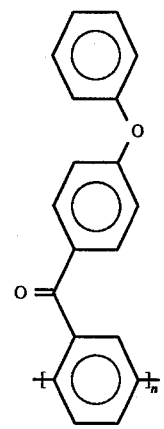

Poly-1,4-(4'-phenoxybenzoylphenylene), 2

Some of the polymers of the present invention will melt to form free flowing liquids. Poly-1,4-(methoxyethoxyethoxyethoxycarbonylphenylene), 3, is a freely flowing liquid at about 250° C. if protected from air. It was totally unexpected that high MW rigid-rod polyphenylenes having side groups with molecular weights less than 300 could be compression molded. It was even more surprising that such polymers would melt without decomposing.

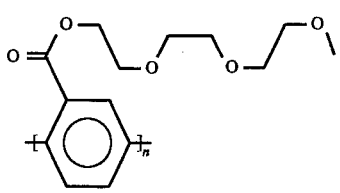

Polymer 3

In addition to solubility, the side groups impart fusibility. That is the side groups lower the $T_g$ and melt viscosity to ranges suitable for thermoprocessing. Polyparaphenylene devoid of side groups is essentially infusible. It can be sintered at high temperature and pressure but it cannot be injection or compression molded or thermoformed by conventional techniques. Likewise other known rigid-rod polymers such as poly(benzobisthiazole) and rigid-rod polyquinolines are not thermoformable. The polymers of the present invention are thermoformable. Rigid-rod polyphenylenes having long, very flexible side groups will melt. For example, the triethylene glycol side groups of 3 imparts a low $T_g$ and $T_m$. Even short side groups impart fusibility. Polymer 1 has side groups with molecular weight 105 and no exceptional flexibility. It was unexpected that polymers 1 and 2 could be compression molded. Surprisingly, even relatively high molecular weight 1 ($[\eta]>6$, $MW_w>500,000$ by GPC vs polystyrene standard) can be compression molded to translucent to transparent panels.

The polymers of the present invention have very high tensile moduli. Isotropic cast films and compression molded coupons have given moduli in the range of 1 million pounds per square inch (MPSI) to 3 MPSI. For the same polymer the modulus increases as the molecular weight increases. The high modulus is a clear indication of the rigid-rod nature of these polymers. Tensile moduli for polyphenylenes have not been reported, presumably because known polyphenylenes have molecular weights too small to give film flexible enough to be tested.

It is well known that rigid-rod polymers form liquid crystalline solutions if their aspect ratio and hence molecular weight increase beyond a critical value. Many pseudo-rigid-rod polymers are known to form liquid crystalline phases as they melt. It was therefore unexpected to find that the rigid-rod polymers 1, 2 and 3 neither form liquid crystalline solutions nor thermotropic liquid crystalline phases, even at intrinsic viscosity of over 7 and GPC molecular weights over 500,000. This is an advantage in molding operations where liquid crystallinity can lead to poor weld lines, poor transverse mechanical properties, poor compressive strength, and a fibrillar morphology. Polymers 1 and 2, in contrast give nearly isotropic molded panels, show no evidence of crystallinity, and do not have a fibrillar structure. The low crystallinity of the polymers of the present invention is advantageous in many applications including molding, matrix resins, optical polymers, and blending.

Because the polymers of the present invention are soluble and will melt they can be processed using a wide variety of techniques. Polymer solutions may be spun into fibers by wet spinning, wherein the polymer solution is forced through an orifice directly into a non-solvent. The polymer forms a continuous fiber as it precipitates and may be washed dried and further processed in one continuous operation. Spinnerets having multiple orifices may be used to form poly-filament yarn. The orifices may have shapes other than round. The polymers of the present invention may also be dry jet wet spun, wherein an air gap is maintained between the spinneret and the non-solvent.

Fibers may also be spun from a gel state. Gels have significantly different visco-elastic properties than liquids, and spinning fiber or casting film from a gel will often give products with dramatically different physical properties than those processed from simple solutions. Fibers spun from gels will can have a high degree of molecular orientation resulting in stronger, stiffer fibers.

Fibers may also be spun directly from the melt. This method is environmentally the cleanest since it does not require any solvents. The polymer is heated and forced through an orifice. Orientation may occur at the orifice as a result of expansive flow. Orientation may also be induced by controlling the tension on the fiber to cause stretching. Multifilament yarn may also be spun from the melt.

Fibers spun by any method may be further treated to influence physical and chemical properties. Further stretching, heating, twisting, etc. may be used to improve mechanical properties. Chemical treatments such as surface oxidation, reduction, sizing, coating, etching, etc. may be used to alter the chemical properties such as interaction with adhesives, matrix resins, dyes, and the like, and may also alter physical properties, such as appearance, tensile strength, flexural strength, resistance to light, heat and moisture, and the like.

Referring to FIG. 1, there is shown a semi-schematic view of a multi-filament fiber 10 comprising a plurality of monofilaments 12, comprising a rigid-rod or segmented rigid-rod polymer provided in accordance with practice of the present invention.

The polymers of the present invention may also be fabricated into film. As with fibers many different methods may be used to form films. Since the rigid-rod and segmented rigid-rod polymers of this invention are both soluble and meltable, all of the conventional film forming techniques are applicable. Films may be cast from solution onto a substrate and the solvent removed either by emersion into a non solvent or by oven drying, under a vacuum or inert atmosphere if necessary. Either continuous or batch processes may be used. Films may also be extruded from the melt through a slit. Films may also be formed by blow extrusion. Films may also be further processed by stretching and/or annealing. Special films such as bilayers, laminates, porous films, textured films and the like may be produced by techniques known in the art.

Films, like fibers, may be oriented by stretching. Stretching along one dimension will result in uniaxial orientation. Stretching in two dimensions will give biaxial orientation. Stretching may be aided by heating near the glass transition temperature. Stretching may also be aided by plasticizers. More complex processes such as applying alternating cycles of stretching and annealing may also be used with the polymers of the present invention.

Figure 2:
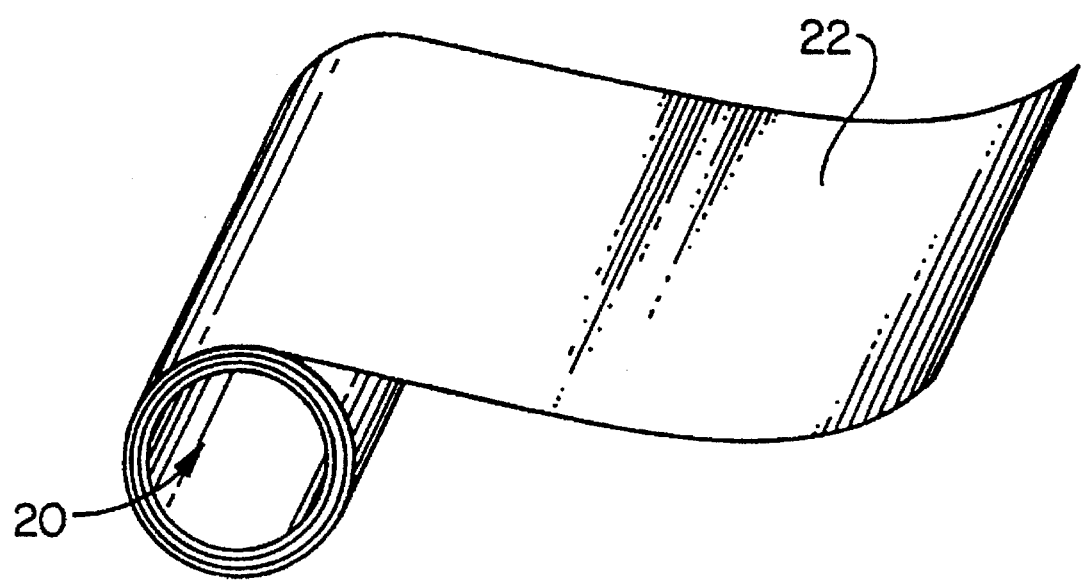
FIG. 2 is a semi-schematic perspective view of a roll of free-standing film provided in accordance with practice of the present invention.

Referring to FIG. 2, there is shown a roll 20 of free-standing film 22, formed from a rigid-rod or segmented rigid-rod polymer, prepared in accordance with practice of the present invention.

The polymers of the present invention may also be fabricated into membranes useful for separations of mixed gases, liquids and solids. Membranes may be produced by the usual methods, for example asymmetric membranes by solvent casting. Filters may be prepared by weaving fibers prepared as described above, or forming non-woven mats from chopped fibers or fibrous material produced by precipitation of polymer solution with a non-solvent.

Figure 3:
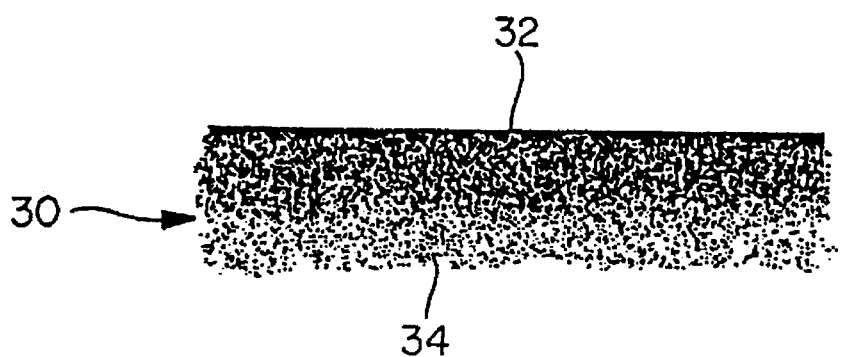
FIG. 3 is a semi-schematic cross-sectional view of a semi-permeable membrane provided in accordance with practice of the present invention.

Referring to FIG. 3, there is shown a cross-sectional side view of a semi-permeable membrane 30 comprised of a rigid-rod or segmented rigid-rod polymer provided in accordance with practice of the present invention. As a result of the casting technique, the upper surface 32 has very small pores and is denser than the lower surface 34, which has courser pores. The asymmetric structure of the membrane provides for higher selectivity and faster flow rates.

Coatings may also be formed by any of the established techniques, including but not limited to: coating from solution, spray coating of solution, spin coating, coating from a latex, powder coating, laminating preformed films, spray coating molten droplets, and coating from the melt.

Various molding techniques may be used to form articles from the polymers of the present invention. Powders, pellets, beads, flakes, reground material or other forms of rigid-rod and segmented rigid-rod polyphenylenes may be molded, with or without liquid or other additives, premixed or fed separately. Rigid-rod and segmented rigid-rod polyphenylene may be compression molded, the pressure and temperatures needed being dependent on the particular side groups present. Exact conditions may be determined by trial and error molding of small samples. Upper temperature limits may be estimated from thermal analysis such as thermogravimetric analysis. Lower temperature limits may be estimated from $T_g$ as measured for example by Dynamic Mechanical Thermal Analysis (DMTA). Some suitable conditions for particular side groups are given in the examples below.

Some of the polymers provided in accordance with the present invention may also be injection molded. To determine if a particular polymer can be injection molded it is necessary to measure the melt viscosity under shear, typically using a capillary melt flow rheometer. Typically polymers having melt viscosities of less than 10,000 poises at shear rates greater than $10^3$ sec$^{-1}$ can be injection molded. To be suitable for injection molding, polymers must also remain fluid (ie. without gelling or solidifying) at the molding temperature during the molding operation. It is also desirable if the polymer can be remelted several times without degradation, so that regrind from molding processes can be used. Particular examples of rigid-rod and segmented rigid-rod polyphenylenes which meet these requirements are given below. However, injection molding is not limited to the particular side groups shown, and the utility of injection molding for any of the polymers of the present invention may readily be determined by one skilled in the art.

Figure 4:
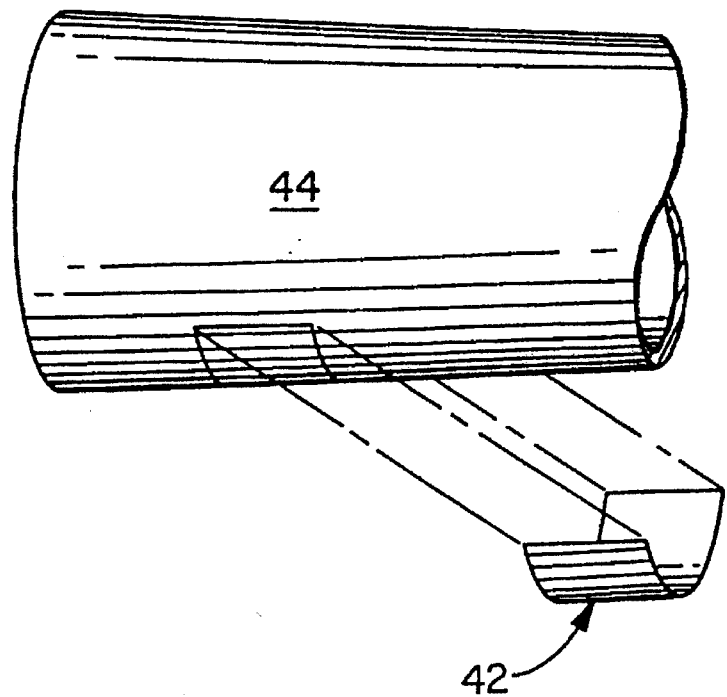
FIG. 4 is a semi-schematic perspective view of a radome provided in accordance with practice of the present invention mounted on the leading edge of an aircraft wing.

Referring to FIG. 4, there is shown a schematic view of a radome 42 molded from a rigid-rod or segmented rigid-rod polymer provided in accordance with practice of the present invention. The radome 42 is shown mounted on the wing structure 44 of an aircraft. The radome is essentially a radar transparent cover which is structurally self-supporting.

In addition to films and fibers, other forms of rigid-rod and segmented rigid-rod polyphenylenes may be produced by extrusion. Non-limiting examples include: angle, channel, hexagonal bar, hollow bar, I-beam, joining strip, rectangular tube, rod, sheet, square bar, square tube, T-section, tubes, or other shapes as is required for a particular application. Related to extrusion is pultrusion, wherein a fiber reinforcement is continuously added to an extruded polymer. The polymers of the present invention may be used as a thermoplastic matrix which is pultruded with fibers, such as carbon fiber or glass fiber. Alternatively, the polymers of the present invention may be used as the fiber for pultrusion of a thermoplastic having a lower processing temperature. In the first case, composites with exceptional moduli and compressive strength will result. In the second case, lower cost thermoplastics having moderate moduli and strength can be formed into composites with high moduli and strength by the incorporation of rigid-rod or segmented rigid-rod polyphenylene fibers. Such a composite is unique in that the reinforcing fibers are themselves thermoplastic and further processing at temperatures above the fiber $T_g$ will result in novel structures as the fibers physically and/or chemically mix with the matrix.

Many of the forms of rigid-rod and segmented rigid-rod polyphenylenes alluded to above, i.e., fiber, film, sheet, rod, etc., may be further processed and combined with other material to yield articles of higher value. Sheet stock may be cut, stamped, welded, or thermally formed. For example, printed wiring boards may be fabricated from sheet or thick films by a process wherein copper is deposited on to one or both sides, patterned by standard photolithographic methods, etched, then holes are drilled, and several such sheets laminated together to form a finished board. Such boards are novel in that they do not contain any fiber reinforcement. Such reinforcement is not necessary because of the unusually high modulus of the instant polymers. Such boards are also unique in that they may be bent into non-planar structures, by application of heat and pressure, to better fit limited volume enclosures, such as laptop computers. Sheet and film may also be thermoformed into any variety of housings, cabinets, containers, covers, chassis, plates, panels, fenders, hoods, and the like.

Figure 5:
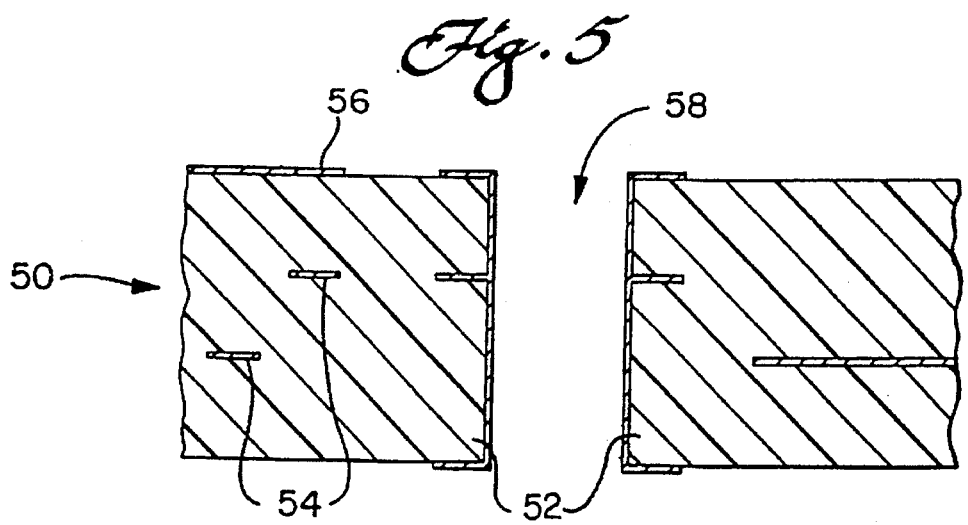
FIG. 5 is a schematic cross-sectional side view of a four-layer printed wiring board provided in accordance with practice of the present invention.

Referring to FIG. 5, there is shown a semi-schematic cross-sectional side view of a four-layer wiring board 50. The board is comprised of rigid-rod or segmented rigid-rod polymer dielectric 52. Copper lines 54 are embedded in the dielectric 52 to form the inner two circuit planes. Copper lines 56 on the surface of the board form the two outer circuit planes. A via 58 is used to connect conducting lines in different planes. The via 58 connects conducting lines in the two outer planes with the line in one of the inner planes. The dielectric 52 can be a pure rigid-rod polymer, a segmented rigid-rod polymer, a blend, a laminate or fiber-containing composite.

Figure 6:
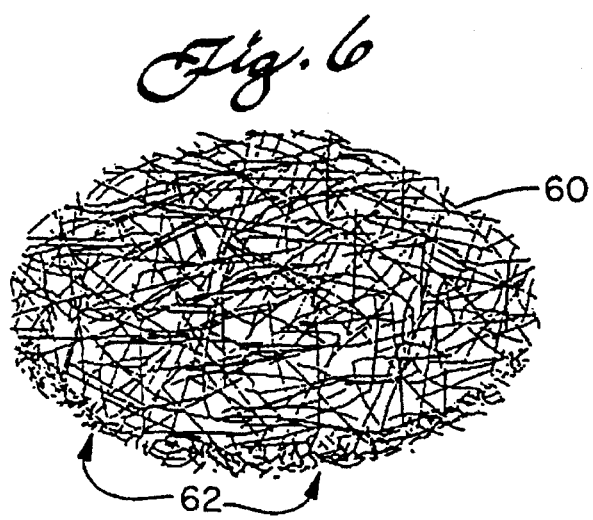
FIG. 6 is a semi-schematic perspective view of a nonwoven mat provided in accordance with practice of the present invention.

Referring to FIG. 6, there is shown a non-woven mat 60 which consists of chopped fibers 62 comprised of a rigid-rod or segmented rigid-rod polymer provided in accordance with practice of the present invention. Such non-woven mats may be used as filters or the like.

Figure 7:
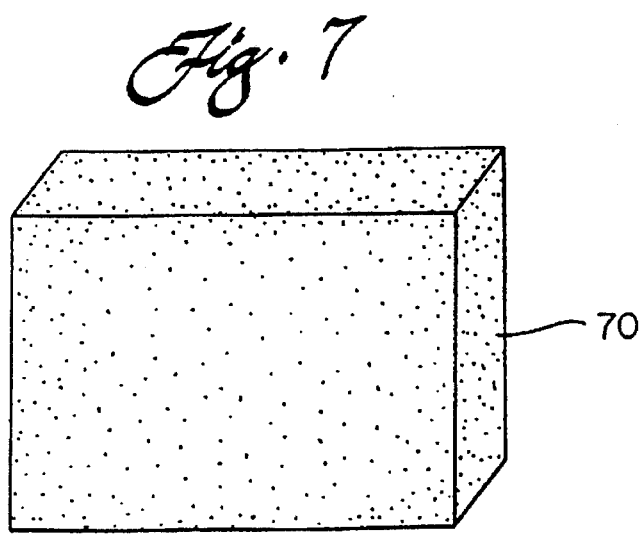
FIG. 7 is a semi-schematic perspective view of a block of foam provided in accordance with practice of the present invention.

Referring to FIG. 7, there is shown a block of foam 70 comprising a rigid-rod or segmented rigid-rod polymer provided in accordance with practice of the present invention.

Rigid-rod and segmented rigid-rod polyphenylenes may also form the dielectric layers of multichip modules. Multichip modules (MCM) are similar to printed wiring boards except that integrated circuits are mounted directly on the MCM without prior packaging. The integrated circuits may be more closely packed, saving total system volume, reducing propagation delays, and increasing maximum operating frequency, among other benefits. The basic structure of a multichip module is shown in FIG. 8. There are alternating layers of dielectric and current carrying conducting lines. Means for electrically and physically attaching integrated circuits is provided, as well as interconnection to the next highest level of packaging. Such MCM structures may be fabricated by many diverse processes. Because the rigid-rod and segmented rigid-rod polyphenylenes of the present invention both melt and dissolve in common solvents any of the currently practiced methods of MCM fabrication may be applied.

Referring to FIG. 8, a semi-schematic cross-sectional side view of an MCM, provided in accordance with practice of the present invention is shown. The MCM is typically (but not necessarily) fabricated using photolithographic techniques similar to those used in integrated circuit fabrication. As a non-limiting example an MCM may be constructed by spin coating a layer 82 of rigid-rod or segmented rigid-rod polyphenylene onto a silicon substrate 84, having a plurality of resistors 86 on its surface, to thereby form a dielectric layer. The polyphenylene layer 82 may be further cured thermally or chemically if necessary. A layer of copper 88 is deposited onto the polyphenylene layer, and a layer of photoresist (not shown) is deposited, exposed, developed and the underlying copper etched through the developed pattern in the resist. A second layer 90 of rigid-rod or segmented rigid-rod polyphenylene is spin coated and cured. Vias (not shown) to the underlying copper lines are cut, for example by laser drilling. Additional layers of copper 92 and dielectric 94 are added and patterned. Completed MCM's may have six or more alternating layers depending on the circuit complexity. The dielectric for MCM's may also be fabricated by laminating films, by spray coating or by other methods known in the art. The rigid-rod or segmented rigid-rod polyphenylene layer itself may be photosensitive, allowing additional methods of processing. Photosensitivity of the rigid-rod or segmented rigid-rod polyphenylene will depend on the side group and addition of catalysts and sensitizers.

The polymers of the present invention may also be combined with a variety of other polymers, additives, fillers, and the like, collectively called additives, before processing by any of the above or other methods. For example, the polymers of the present invention may be blended with some amount of a more flexible polymer to improve the extension-to-break of the blend. Thus, finished products formed from such a blend, e.g., film, sheet, rod or complex molded articles will be relatively tougher. Rubbers may be added to toughen the finished product. A liquid crystalline polymer may be added to reduce melt viscosity. Many other combinations will be apparent to those skilled in the art. The particular amounts of each additive will depend on the application but may cover the range from none (pure rigid-rod or segmented rigid-rod polyphenylene) to large amounts. As the amount of additives becomes much larger than the amount of rigid-rod polyphenylene the rigid-rod polyphenylene itself may be considered an additive.

Polymers comprising the rigid-rod and segmented rigid-rods of the present invention can also be used in structural applications. Because of their high intrinsic stiffness, parts fabricated with rigid-rod or segmented rigid-rod polymers will have mechanical properties approaching or equal to fiber containing composites. In many applications where fibers are necessary for structural reasons they cause other undesirable effects. For example, radomes for airborne radar are typically constructed of glass fiber reinforced composites, but the glass fibers lead to signal loss and degradation of radar performance. Fiberless radomes comprised of rigid-rod or segmented rigid-rod polymers would improve radar performance over composite radomes. Fiberless radomes would also be easier to fabricate than composite radomes. Fiberless radomes comprising rigid-rod or segmented rigid-rod polymers provided in accordance with the present invention could be injection or compression molded or stamped from sheet, or machined from stock.

Rigid-rod and segmented rigid-rod polymers can also be used to advantage in fiber containing composites as the matrix resin. As is known in the art the compressive strength of composites is related to the modulus of the matrix resin. Referring to FIGS. 9 and 9A, a composite 100 comprising reinforcing fibers 102 and 104 in the plane of the composite surface is shown. The fibers 102 run in a direction perpendicular to the fibers 104. Resins with high moduli will give composites with high compressive strength. The polymers of the present invention can be used to form composites by any of the established techniques, such as solution or powder impregnating (prepregging) fiber tows, yarns, tapes and fabrics, followed by lay-up of the prepregs to the desired shape with a mold or form, and consolidating the composite by application of heat and pressure. Additives may be used as is known in the art including mold releases, antioxidants, curing agents, particulates, tougheners and the like.

Non limiting examples of additives which may be used with rigid-rod or segmented rigid-rod polyphenylenes are: adhesion promoters, antioxidants, carbon black, carbon fibers, compatibilizers, curing agents, dyes, fire retardants, glass fibers, lubricants, metal particles, mold release agents, pigments, plasticizers, rubbers, silica, smoke retardants, tougheners, UV absorbers, and the like.

The rigid-rod and segmented rigid-rod polymers of the present invention may be used as additives to modify the properties of other polymers and compositions. Relatively small amounts of the polymers of the present invention will significantly increase the mechanical properties of flexible polymers. Addition of about 5% of the polymer 1 to a blend of polystyrene and polyphenylene oxide increases the tensile modulus by about 50%. The polyphenylenes of the present invention may be added to any other polymer. The degree of improvement of mechanical properties will depend on the properties of the other polymer without the added polyphenylene, on the amount of polyphenylene used, on the degree to which the polyphenylene is soluble in the other polymer, and on the amounts and types of additives or compatibilizers.

In general, polymers of differing types do not mix. There are many exceptions to this rule and many pairs of completely miscible polymers are known. For most of these miscible polymers specific interactions result in a negative heat of mixing, for example, hydrogen bonding, or ionic interactions. Polymer pairs which are not miscible can often be made miscible by addition of a third polymer, typically a low MW copolymer having segments similar to the polymers to be blended. Use of these and other types of compatibilizers are known in the art. These techniques may be applied to the rigid-rod and segmented rigid-rod polyphenylenes of the present invention to enhance their utility as additives. Thus a copolymer having segments which interact strongly with a rigid-rod polyphenylene as well as segments which interact strongly with a second polymer will act as a compatibilizer for the two. Smaller molecules such as NMP, triphenylphosphate, and diphenylether will also aid compatibility by solvating the polyphenylenes of the present invention. It will also be apparent to one skilled in the art that the particular side group on the rigid-rod or segmented rigid-rod polyphenylene will strongly influence its ability to blend. In general the side group should be chosen so that there is a negative heat of mixing between the side group and the polymer in which it must mix. It should also be apparent that complete miscibility is not always required. Blending often results in mixing on a microscopic, but not molecular, level. Such blends will have properties different than the pure polymers and are often desirable. Even blends with macroscopic phases may have utility and may be considered another form of composite.

Rigid-rod and segmented rigid-rod polyphenylenes will be particularly useful as additives for flame retardants, smoke retardants, tougheners, or to control or enhance creep resistance, coefficient of thermal expansion, viscosity, modulus, tensile strength, hardness, moisture resistance, gas permeability, and abrasion resistance.

GENERAL PROCEDURES

1. 2,5-dichlorobenzoyl-containing compounds

A wide variety of 2,5-dichlorobenzoyl-containing compounds (e.g. 2,5-dichlorobenzophenones and 2,5-dichlorobenzamides) can be readily prepared from 2,5-dichlorobenzoylchloride. Pure 2,5-dichlorobenzoylchloride is obtained by vacuum distillation of the mixture obtained from the reaction of commercially available 2,5-dichlorobenzoic acid with a slight excess of thionyl chloride in refluxing toluene. 2,5-dichlorobenzophenones (e.g. 2,5-dichlorobenzophenone, 2,5-dichloro-4'-methylbenzophenone, 2,5-dichloro-4'-methoxybenzophenone, and 2,5-dichloro-4'-phenoxybenzophenone) are prepared by the Friedel-Crafts benzoylations of an excess of benzene or substituted benzenes (e.g. toluene, anisole, or diphenyl ether, respectively) with 2,5-dichlorobenzoylchloride at 0°–5° C. using 2–3 mole equivalents of aluminum chloride as a catalyst. The solid products obtained upon quenching with water are purified by recrystallization from toluene/hexanes. 2,5-dichlorobenzoylmorpholine and 2,5-dichlorobenzoylpiperidine are prepared from the reaction of 2,5-dichlorobenzoylchloride and either morpholine or piperidine, respectively, in toluene with pyridine added to trap the hydrogen chloride that is evolved. After washing away the pyridinium salt and any excess amine, the product is crystallized from the toluene solution.

2. Activated Zinc Powder

Activated zinc powder is obtained after 2–3 washings of commercially available 325 mesh zinc dust with 1 molar hydrogen chloride in diethyl ether (anhydrous) and drying in vacuo or under inert atmosphere for several hours at about 100°–120° C. The resulting powder should be sifted (e.g. a 150 mesh sieve seems to be satisfactory), to remove the larger clumps that sometimes form, to assure high activity. This material should be used immediately or stored under an inert atmosphere away from oxygen and moisture.

The following specific examples are illustrative of the present invention, but are not considered limiting thereof in any way.

EXAMPLE 1

Poly-1,4-(benzoylphenylene)

Anhydrous bis(triphenylphosphine) nickel(II) chloride (34.7 g; 53 mmole), triphenylphosphine (166.6 g; 741 mmole), sodium iodide (34.6 g, 231 mmole), and 325 mesh activated zinc powder (181.8 g, 2.8 mole) were weighed into a bottle under an inert atmosphere and added to an oven dried 12-liter flask, containing 1.6 liters of anhydrous N-methylpyrrolidinone (NMP), against a vigorous nitrogen counterflow. This mixture was stirred for about 15 minutes, leading to a deep-red coloration. Solid 2,5-dichlorobenzophenone (466 g, 1.86 mol) and another 0.8 liters of anhydrous NMP were then added to the flask. After an initial slight endotherm (due to dissolution of monomer), the temperature of the vigorously stirred reaction mixture warmed to about 60° C. over 30 minutes and was held there (60°–65° C.) by use of a cooling bath. After stirring for an additional 10–15 minutes, the viscosity of the reaction mixture increased drastically and stirring was stopped. After heating this mixture for several days at 65° C., the resulting viscous solution was poured into 10 L of 1 molar hydrochloric acid in ethanol to dissolve the excess zinc metal and to precipitate the macromonomer. This suspension was filtered and the precipitate triturated with acetone and dried to afford 283 g (85% yield) of a fine pale-yellow powder.

The sample was found to have an intrinsic viscosity of 7.2 dL/g in 0.05 molar lithium bromide in NMP at 40° C. GPC analysis indicated a weight average molecular weight, relative to narrow polydispersity polystyrene standards, of 550,000–600,000.

EXAMPLE 2

Poly-1,4-(4'-phenoxybenzoylphenylene)

2,5-Dichloro-4'-phenoxybenzophenone

To a 22 L open-mouth round bottom flask fitted with a three-necked flange head, a mechanical stirrer, a nitrogen inlet and an outlet connected to a HCl scrubbing tower was added 2,5-dichlorobenzoic chloride (4500 g, 21.5 mol) and phenyl ether (5489 g, 32.3 mol). The solution was cooled in ice to 5° C. under stirring and aluminum chloride (3700 g, 27.8 mol) was added slowly. After about 300 g aluminum chloride was added, the solution started to foam violently. The rest was added carefully over about 10 min. On several occasions, the stirring had to be stopped to control the foaming. The temperature of the reaction mixture was about 35° C. after the addition. The mixture was then stirred for about 30 min. and poured into about 20 gallon of ice water. The large reddish mass was dissolved by adding about 12 L of methylene chloride and stirring. The organic layer was separated and the aqueous layer was extracted with some methylene chloride. After methylene chloride was removed from the combined organic layer by distillation, the residue was recrystallized twice from cyclohexane (2×10 L), washed with cooled hexane, air dried and then vacuum dried to afford 5387 g monomer (73%). The mother liquor was kept for later recovery of remaining product.

Poly-1,4-(4'-phenoxybenzoylphenylene)

To a 12 L open-mouth round bottom flask equipped with a flange head, an air driven stirrer, a thermowell with a thermocouple, and a nitrogen purge line, was added under nitrogen bis(triphenylphosphine)nickel(II) chloride (58.2 g, 88.9 mmol), sodium iodide (54.7 g, 365 mmol), triphenylphosphine (279.3 g, 1065 mmol), 325 mesh activated zinc dust (239.5 g, 3663 mmol) and anhydrous N-methylpyrrolidinone (NMP) (3400 ml). The solution was stirred and heated with a hot air gun to 40° C. The monomer 2,5-dichloro-4'-phenoxybenzophenone (935 g, 2725 mmol) was added. The temperature dropped to 36.3° C. and then climbed to about 65° C. when an ice water bath was used to control the temperature below 86° C. After about 15 min. the mixture became viscous. After 17 min. the solution became very thick and the stirring was stopped. The reaction mixture was allowed to come to room temperature and was left to stand overnight. The next morning the reaction mixture was coagulated into an acetone bath and ground up in a blender. The crude polymer was then stirred for several days in 1 molar hydrochloric acid in ethanol to remove the excess zinc metal. The polymer was collected by filtration, washed with water and acetone and dissolved in 16 L of methylene chloride. The solution was filtered through 10 um polypropylene membrane with the aid of celite, coagulated in the same volume of acetone, filtered, extracted with acetone for three days and dried to afford 700 g pale yellow polymer (94%). GPC analysis showed a weight average molecular weight of 653,000 with the polydispersity being 1.97, relative to polystyrene standard.

EXAMPLE 3

Poly-1,4-(2-[2-(2-methoxyethoxy)ethoxy]ethoxycarbonyl)phenylene

2-[2-(2-Methoxyethoxy)ethoxy]ethyl 2,5-dichlorobenzoate (Triethyleneglycol 2,5-dichlorobenzoate)

To a round bottom flask fitted with a Dean-Steak water separation apparatus, a magnetic stirrer and a condenser were added 2,5-dichlorobenzoic acid (20 g, 0.11 mol), triethylene glycol monomethylether (30 ml, 0.17 mol), concentrated sulfuric acid (0.4 ml) and benzene (100 ml). The mixture was refluxed for 3 days and about 1.8 ml of water was collected. The solution was cooled to room temperature and the solvent was removed on a rotary evaporator. The residue was diluted with ether and washed with diluted aqueous sodium bicarbonate, washed with brine, and dried with magnesium sulfate. The liquid obtained after the removal of solvent was purified by filtration through about 5 g of basic alumina, with methylene chloride as the eluent. The fraction, after distillation of solvent, was dried under vacuum overnight with stirring to afford 30.8 g of pure ester (88%).

Poly-1,4-(2-[2-(2-methoxyethoxy)ethoxy] ethoxycarbonyl)phenylene

Into a 100 ml round bottom flask containing NMP (7.5 ml) were weighted in a glove box anhydrous nickel(II) chloride (30 mg, 0.23 mmol), sodium iodide (125 mg, 0.83 mmol), triphenylphosphine (0.5 g, 1.91 mmol), activated zinc dust (0.65 g, 10.16 mmol). This mixture was stirred with a magnetic stirrer for 40 min. at 50° C., leading to a deep red solution. Monomethylated triethyleneglycol 2,5-dichlorobenzoate (2.8 g, 7.95 mmol) was added as a neat liquid with a syringe. The mixture was stirred at this temperature for 3 days, resulting a viscous solution. Ethanol (100 ml) was added. A suspension was obtained after stirring. It became a clear and almost colorless solution when 10 ml of 36% hydrochloric acid was added. The solution then was neutralized with diluted aqueous sodium hydroxide. The resulting suspension containing gel-like polymer was extracted with methylene chloride. The organic layer was filtered and concentrated. The polymer was precipitated with ethanol, separated by using a centrifuge and dried under vacuum. A white, gum-like solid was obtained (1.48 g, 67%). The weight average molecular weight, relative to polystyrene standard, was 116,000 according to GPC analysis.

EXAMPLE 4

Poly-1,4-(3'-methylbenzoylphenylene)

2,5-Dichloro-3'-methylbenzophenone

A mixture of m-toluoyl chloride (22 g, 0.17 mol) and 1,4-dichlorobenzene (120 g, 0.82 mol) was heated to 100° C. in a flask. Aluminum chloride (60 g, 0.45 mol) was added in one portion. Hydrogen chloride started to evolve from the solution. The mixture was heated to 170° C. in 30 min. and stirred at this temperature for 3 hours. The resulting brownish solution was cooled to about 80° C. and poured onto ice. Ether (50 ml) was added. The organic layer was separated and distilled under vacuum after the removal of ether. The residue from distillation was recrystallized twice from hexane to give 20 g of white crystals (53%).

Poly-1,4-(3'-methylbenzoyl)phenylene

Anhydrous nickel(II) chloride (60 mg, 0.47 mmol), sodium iodide (175 mg, 1.17 mmol), triphenylphosphine (0.75 g, 2.86 mmol), activated zinc dust (2.3 g, 35.9 mmol) were weighed in a glove box into a 100 ml round bottom flask containing NMP (8 ml). This mixture was stirred with a magnetic stirrer for 30 min. at 50° C., leading to a deep red solution. A solution of 2,5-dichloro-3'-methylbenzophenone (2.6 g, 9.85 mmol) in NMP (7 ml) was added. A viscous solution was obtained after stirring for 40 minutes. The mixture was kept at this temperature for another 10 hours and then at 65° C. for another 3 days. Ethanol was added to the reaction mixture. The solid was moved into a blender, ground into small pieces and then stirred with 50 ml of 1 molar hydrochloric acid in ethanol for 2 hours. The off-white solid was filtered and stirred with acetone overnight. Filtration and vacuum drying gave 1.62 g off-white powder (85%). The weight average molecular weight, relative to polystyrene standard, was 139,000 according to GPC analysis.

EXAMPLE 5

Melt extrusion of Poly-1,4-(4'-phenoxybenzoylphenylene)

Poly-1,4-(4'-phenoxybenzoylpheneylene) provided in accordance with Example 2 is dried to constant weight in a vacuum oven at 170° C. The dry polymer is loaded into the hopper of a twin screw extruder with inlet and barrel temperature set to 270° C.

In a first extrusion run, the extruder is fitted with a heated die having a 50 cm by 2 mm slit. The extruded sheet is air cooled and cut into 50 cm lengths. The sheet stock is thermoformed by pressing between shaped platens of a steel mold at 250° C. and 500 psi.

In a second extrusion run, the extruder is fitted with a heated die having a 10 cm by 0.2 mm slit. The extruded film is passed through a train of heated rollers and then abruptly accelerated between two rollers of different speeds to stretch the film by about 500%. Addition heat may be applied to keep the film above its $T_g$ (about 160° C.) by radiant heating. The stretched film is annealed and cooled on a further roller train and collected as a continuous roll.

In a third extrusion run, the extruder is fitted with a die having 500 spinnerets, each 200 microns in diameter at the exit. The polymer is extruded through the die and the multifilaments allowed to air cool before being collected on a windup bobbin.

In a fourth extrusion run, the extruder is fitted with a die having 200 spinnerets, each 400 in diameter microns at the exit. The extruded filaments are pulled away from the exit at high velocity resulting in a draw ratio of about 12. The oriented fiber is collected on a windup bobbin.

In a fifth extrusion run, the extruder is fitted with a die suitable for extrusion of ½ inch pipe having 1/16 inch wall thickness. The pipe is cut into 4 foot lengths.

EXAMPLE 6

Production of Angle Stock of poly-1,4-(4'-phenoxybenzoylphenylene)

A blend of poly-1,4-(4'-phenoxybenzoylphenylene) provided in accordance with Example 2, 200 g, polystyrene, 1000 g, and triphenylphosphate, 100 g is loaded into the hopper of a single screw extruder. The blend is extruded through a die having an L shaped slit 1 inch by 1 inch by 3/16 inch to produce angle stock.

EXAMPLE 7

Production of Fibers of poly-1,4-(4'-phenoxybenzoylphenylene)

50 g of poly-1,4-(4'-phenoxybenzoylphenylene) provided in accordance with Example 2 is dissolved in a mixture of NMP, 25 ml, and methylene chloride, 425 ml by stirring for 48 hours. The viscous solution is pumped through a 0.2 mm orifice.

In the first run, the orifice is submerged at one end of a one meter trough containing 95% ethanol. The solution coagulates as it is injected into the ethanol. The coagulated polymer is manually pulled through the trough to the end opposite the orifice where it is threaded through rollers and attached to a take up spool. The speed of the take up spool is regulated to provide a constant tension to the fiber.

In the second run, the orifice is held one centimeter from the surface at one end of a trough containing 95% ethanol. The solution is forced through the orifice as a fine jet directed downward. The solution coagulates as it impinges on the ethanol. The coagulating fiber is fed around a roller and across the trough to the opposite end where it is collected on a constant tension take up roll.

EXAMPLE 8

Coating a Silicon Wafer with poly-1,4-(4'-phenoxybenzoylphenylene)

50 g is of poly-1,4-(4'-phenoxybenzoylphenylene) dissolved in a mixture of NMP, 25 ml, and methylene chloride 425 ml by stirring for 48 hours. A 4" silicon wafer is coated with a thin film of poly-1,4-(4'-phenoxybenzoylphenylene) by spin coating the solution at 300 rpm for 15 sec followed by 1500 rpm for 60 sec. The coated wafer is further dried in a 100° C. vacuum oven for 6 hrs.

EXAMPLE 9

Melt Spray Coating with poly-1,4-(4'-phenoxybenzoylphenylene)

A blend of poly-1,4-(4'-phenoxybenzoylphenylene) 50 g, and polystyrene, 400 g are loaded into the heated reservoir of a spray gun. The molten blend is forced by compressed nitrogen through the gun nozzle to form a coarse spray. The spray is directed such that a metal part is uniformly covered with polymer. The coated part may be heated further in an oven to level the polymer coating.

EXAMPLE 10

Powder Prepregging with poly-1,4-(4'-phenoxybenzoylphenylene)

Poly-1,4-(4'-phenoxybenzoylphenylene) provided in accordance with Example 2 is prepared as a powder having average particle size of about 10 microns. The powder is placed at the bottom of a closed chamber having a means to stir the powder. Carbon fiber tow is drawn through the chamber whereupon the stirred powder forms a dust cloud which adheres to the carbon fibers. On leaving the powder chamber the coated carbon fibers then pass through a 150° C. oven to fix the polymer powder. The resulting prepreg may be used to form composites by further forming and processing under heat and pressure.

EXAMPLE 11

Composite Fabrication with Prepreg from poly-1,4-(4'-phenoxybenzoylphenylene)

The prepreg of Example 10 is wound onto a cylindrical tool. Heat and pressure are applied as the prepreg tow contacts the cylinder surface so as to consolidate the polymer powder. The cylinder is completely wound with six layers of prepreg. During this operation the new layers are bonded to the underlying layers with local application of heat and pressure. This on-line consolidation allows large parts to be fabricated without the use of an autoclave.

EXAMPLE 12

Comingled Filament Winding with poly-1,4-(4'-Dhenoxybenzoylphenylene) Fibers

The fiber tow of the fourth extrusion run of Example 5 is co-mingled with carbon fiber tow having 500 filaments and wound on a bobbin. The resulting tow is used to filament wind a nosecone. The nosecone and tool are placed in a 200° C. oven for 1 hour to consolidate the polymer filaments.

EXAMPLE 13

Pultrusion with Rigid-Rod Polyphenylene Fibers

The fiber tow of the fourth extrusion run of Example 5 is continuously pulled through a polyetheretherketone melt and co-extruded through a die to form ribbed panels.

EXAMPLE 14

Blow Molding of a polycarbonate poly-1,4-(4'-phenoxybenzoylphenylene) Blend

A 90:10 blend of polycarbonate and poly-1,4-(4'-phenoxybenzoylphenylene) provided in accordance with Example 2 is used in an injection blow molding machine to produce 1 liter bottles. In the process a parison is formed by an injection molding operation, the parison is then moved to a mold and inflated to fill the mold. After cooling the finished bottle is removed from the mold.

EXAMPLE 15

Poly-1,4-(4'-phenoxybenzoylphenylene)

Anhydrous bis(triphenylphosphine) nickel(II) chloride (102 g; 0.16 mole), triphenylphosphine (408 g; 1.56 mole), sodium iodide (96 g, 0.64 mole), and 325 mesh activated zinc powder (420 g, 6.42 mole) were weighed into a bottle under an inert atmosphere and added to an oven dried 22-liter flask, containing 4 liters of anhydrous NMP, against a vigorous nitrogen counterflow. This mixture was stirred for about 15 minutes, leading to a deep-red coloration. Solid 2,5-dichloro-4'-phenoxy-benzophenone and another 2 liters of anhydrous NMP were then added to the flask. After an initial slight endotherm (due to dissolution of monomer), the temperature of the vigorously stirred reaction mixture warmed to about 85° C. over 15–20 minutes and was held there by use of a cooling bath. After stirring for an additional 10–15 minutes, the viscosity of the reaction mixture increased drastically and stirring was stopped. After cooling the reaction mixture to room temperature overnight, the resulting viscous solution was coagulated into 25 L of 1 molar hydrochloric acid in ethanol to dissolve the excess zinc metal and to precipitate the polymer. This suspension was filtered, and the precipitate was continuously extracted with ethanol and then with acetone and dried.

To achieve high purity, the crude polymer was dissolved in about 35 liters of NMP, pressure filtered through 1.2 micron (nominal) polypropylene fiber filters, coagulated into about 70 liters of acetone, continuously extracted with acetone, and dried to afford 1,186 g (91% yield) of a fine pale-yellow powder.

The sample was found to have an intrinsic viscosity of 5.0 dL/g in 0.05 molar lithium bromide in NMP at 40° C. GPC analysis indicated a weight average molecular weight, relative to narrow polydispersity polystyrene standards, of 450,000–500,000.

EXAMPLE 16

Copoly-{1,4-(benzoylphenylene)}-{1,3-phenylene}

Anhydrous bis(triphenylphosphine) nickel(II) chloride (10 g; 15 mmole), triphenylphosphine (50 g; 0.19 mole), sodium iodide (12 g, 80 mmole), and 325 mesh activated zinc powder (60 g, 0.92 mole) were weighed into a bottle under an inert atmosphere and added to an oven dried 2-liter flask, containing 800 milliliters of anhydrous NMP, against a vigorous nitrogen counterflow. This mixture was stirred for about 15 minutes, leading to a deep-red coloration. A mixture of 2,5-dichlorobenzophenone (127 g; 0.51 mole) and 1,3-dichlorobenzene (11 ml; 96 mmole) was then added to the flask. After an initial slight endotherm (due to dissolution of monomer), the temperature of the vigorously stirred reaction mixture warmed to about 80°–85° C. over 30 minutes. After stirring for an additional 10–15 minutes, the viscosity of the reaction mixture increased drastically and stirring was stopped. After cooling the reaction mixture to room temperature overnight, the resulting viscous solution was poured into 6 L of 1 molar hydrochloric acid in ethanol to dissolve the excess zinc metal and to precipitate the polymer. This suspension was filtered and the precipitate was continuously extracted with ethanol and then with acetone and dried to afford 93 g (94% yield) of crude white resin.

To achieve high purity, the crude polymer was dissolved in about 600 mL of methylene chloride, pressure filtered through 1.2 micron (nominal) polypropylene fiber filters, coagulated into about 2 liters of acetone, continuously extracted with acetone, and dried to afford 92 g (93% yield) of a fine white powder.

The sample was found to have an intrinsic viscosity of 1.75 dL/g in 0.05 molar lithium bromide in NMP at 40° C. GPC analysis indicated a weight average molecular weight, relative to narrow polydispersity polystyrene standards, of 150,000–200,000. DSC analysis indicated a glass transition temperature of 167° C.

EXAMPLE 17

Copoly-{1,4-(benzoylphenylene)}-{1,4-phenylene}

Anhydrous bis(triphenylphosphine) nickel(II) chloride (3.75 g; 5.7 mmole), triphenylphosphine (18 g; 68.6 mmole), sodium chloride (2.0 g, 34.2 mmole), 325 mesh activated zinc powder (19.5 g, 298 mmole), and 250 mL of anhydrous NMP were weighed into an oven dried 1-liter flask under an inert atmosphere. This mixture was stirred for about 15 minutes, leading to a deep-red coloration. A mixture of 2,5-dichlorobenzophenone (45 g; 179 mmole) and 1,4-dichloro-benzene (2.95 g; 20 mmole) was then added to the flask. The temperature of the vigorously stirred reaction mixture was held at 60°–70° C. until the mixture thickened (about 30 minutes). After cooling the reaction mixture to room temperature overnight, the resulting viscous solution was poured into 1.2 L of 1 molar hydrochloric acid in ethanol to dissolve the excess zinc metal and to precipitate the polymer. This suspension was filtered and the precipitate was washed with acetone and dried to afford crude resin.

To achieve high purity, the crude polymer was dissolved in about 1.5 L of NMP and coagulated into about 4 L of acetone, continuously extracted with acetone, and dried to afford 30 g (89% yield) of an off-white powder.

The sample was found to have an intrinsic viscosity of 4.9 dL/g in 0.05 molar lithium bromide in NMP at 40° C. GPC analysis indicated a weight average molecular weight, relative to narrow polydispersity polystyrene standards, of 346,000. DSC analysis indicated a glass transition temperature of 167° C.

EXAMPLE 18

Preparation of Solvent Cast Thin Films of Rigid-Rod Polyparaphenylenes of Examples 1 and 2.

Two methods are preferred for the preparation of good quality solvent cast films of the polymers provided in accordance with Examples 1 and 2. All films are cast in a particle free, low humidity environment, preferably from filtered polymer solutions.

(a) The first method involves casting from solutions (about 1–15 weight percent, preferably about 3–7 weight percent) in chloroform, anisole, dimethylacetamide (DMAc), N-methylpyrrolidinone (NMP), or other suitable solvents. The solvent is evaporated, if low boiling, or removed in a vacuum or convection oven, if high boiling. The films, especially those thinner than about 1 mil, tend to be brittle but quite strong.

(b) A second method for preparing free-standing films involves casting from a solvent mixture of chloroform and NMP (generally containing about 1–10 volume percent NMP, preferably about 1–2 volume percent). Polymer concentrations typically range from about 1–15 weight percent, preferably about 3–7 weight percent. After casting the film, the chloroform quickly evaporates, leaving a highly NMP swollen (plasticized) but generally tack-free film. The remaining NMP can be easily removed by heating in an oven to form the final dry film, which tends to be quite optically transparent and colorless. Like those prepared from a single solvent, the completely dried films tend to be brittle but strong.

The following film samples were prepared from batches of rigid-rod polyparaphenylenes in Examples 1 and 15 with the specified intrinsic viscosities (related to molecular weight) according to the general procedures specified above and the conditions listed:

| Sample Identification | Polymer of Example | Intrinsic Viscosity (dL/g) | Film Casting Method | Concentration (wt %) | Solvent(s) |
| --- | --- | --- | --- | --- | --- |
| A | 1 | 6.0 | (a) | 4.0 | NMP |
| B | 1 | 5.0 | (b) | 4.0 | $CHCl_3$/NMP |
| C | 1 | 4.0 | (b) | 4.0 | $CHCl_3$/NMP |
| D | 2 | 3.5 | (b) | 6.0 | $CHCl_3$/NMP |
| E | 2 | 5.5 | (b) | 6.0 | $CHCl_3$/NMP |
| F | 2 | 5.0 | (a) | 2.6 | $CHCl_3$ |

The mechanical (tensile) properties of the resulting films (A–F) were measured in accordance with ASTM-D-882 standards. Standard test samples were prepared by carefully cutting the films to the desired size (approximately 6"×0.5"× 0.001"). The films prepared by method (b) were more easily cut (i.e. without microcracking along the edge of the test strip) in their plasticized state. The average test results are presented below:

| Sample Identification | Tensile Strength (ps) | Tensile Modulus (psi) | Elongation (%) |
|---|---|---|---|
| A | 7,000 | 1.0 × 10⁶ | 0.9% |
| B | 31,000 | 2.4 × 10⁶ | 1.6% |
| C | 30,000 | 1.1 × 10⁶ | 1.6–2.1% |
| D | 18,500 | 0.9 × 10⁶ | 1.4–1.9% |
| E | 30,000 | 1.0 × 10⁶ | 3.3 |
| F | 17,400 | 1.4 × 10⁶ | 1.3 |

EXAMPLE 19

The film of Example 18E is dried until it is approximately 5% by weight NMP. The NMP plasticized film is drawn through a set of rollers to give a draw ratio of 5 to 1. The oriented film may be further dried in vacuo at 100° C.

EXAMPLE 20

Compression Molding of Rigid-Rod Poly-1,4-(benzoylphenylene), Example 1 Material, and Poly-1,4-(4'-phenoxybenzoylphenylene), Example 2 Material.

Coupons of the polymers provided in accordance with the procedures of Examples 1 and 2 can be compression molded at relatively moderate temperatures (200°–400° C.) and pressures (200–5,000 psi). Sometimes samples of the polymers of Examples 1 or 2 undergo darkening upon molding at these temperatures, but the properties do not seem to be adversely affected. To obtain 2"×2"×0.1" panels of a batch of the polymer of Example 1 (with an intrinsic viscosity of 4.0 dL/g) or the polymer of Example 2 (with an intrinsic viscosity of 5.0 dL/g), the mold cavity is filled with about 8.0 g of resin and placed into an hydraulic press preheated to the specified temperature. After holding the sample at the molding temperature and molding pressure for the specified molding time, the sample is cooled below at least about 100° C. during the cooling time while retaining the molding pressure. Upon cooling to ambient temperature and removal from the mold, the following panels were obtained according to the specified conditions:

| Sample Identification | Polymer of Example | Molding Temp. (°C.) | Molding Pressure (psi) | Molding Time (minutes) | Cooling Time (hours) |
|---|---|---|---|---|---|
| G | 1 | 250 | 1,800 | 20 | 5 |
| H | 1 | 300 | 2,500 | 20 | 5 |
| I | 1 | 350 | 1,800 | 20 | 5 |
| J | 2 | 350 | 1,250 | 30 | 3 |

The mechanical (flexural) properties of the resulting panels (G-J) were measured in accordance with ASTM-D-790 standards. Standard test Samples were prepared by carefully cutting the panels to the desired size (40 mm×6 mm×2.6 mm). The test results are presented below:

| Sample Identification | Flexural Strength (psi) | Flexural Modulus (psi) | Flexural Strain (%) |
|---|---|---|---|
| G | 20,000 | 1.1 × 10⁶ | 1.9% |
| H | 46,000 | 1.4 × 10⁶ | 4.2% |
| I | 45,000 | 1.3 × 10⁶ | 4.2% |
| J | 32,000 | 1.0 × 10⁶ | 3.8% |

EXAMPLE 21

Sample Fabrication and Properties of Copoly-{1,4-benzoylphenylene)}-{1,3-phenylene}.

A free-standing film, K, sample of copoly-{1,4-benzoylphenylene)}-{1,3-phenylene} ([η]=1.75 dL/g) was prepared by conventional casting techniques from a 5.0% (wt/wt) solution in chloroform. After drying, the mechanical (tensile) properties of the film were measured according to ASTM-D-882 specifications. A molded coupon (2"×2"×0.1"), L, of copoly-{1,4-benzoylphenylene)}-{1,3-phenylene} was prepared by compression molding about 8.0 g of resin at 300° C. and 1,250 psi pressure for 30 minutes and then cooling slowly (about 3 hours) to ambient temperature while maintaining pressure. The mechanical (flexural) properties of the coupons were measured according to ASTM-D-790 specifications; standard test samples were prepared by carefully cutting the coupons to the desired size (40 mm×6 mm×2.5 mm). The following data was obtained for samples K and L:

| Sample identification | Sample type | Measurement Type | Strength (psi) | Modulus (psi) | Strain % |
|---|---|---|---|---|---|
| K | Film | Tensile | 26,000 | 1.1 × 10⁶ | 3.8 |
| L | Coupon | Flexural | 39,000 | 1.0 × 10⁶ | 7.7 |

EXAMPLE 22

Injection Molding of Rigid-Rod Poly-1,4-(4'-phenoxybenzoyl-phenylene)

Complex parts of the polymer provided in accordance with the process of Example 2 were injection molded by standard techniques at moderate temperatures (280° C.). Mechanical (flexural) properties were measured according to ASTM-D-790 specifications and melt viscosity was measured at 280° C. with a melt rheometer with a capillary geometry of 10 mm length and 1 mm diameter at a shear rate of 1,000/sec. The following data was obtained for injection molded strips of dimension 40 mm length×6 mm width×1 mm thickness (MD, machine direction, refers to specimens molded in the long direction (40 mm) to induce some orientation and TD, transverse direction, refers to specimens molded in the short direction (6 mm) to minimize any orientation):

| Sample Identification | Intrinsic Viscosity (dL/g) | Melt Viscosity (poise) | Flexural Strength (psi) | Flexural Modulus (psi) | Flexural Strain % |
|---|---|---|---|---|---|
| M-MD | 5.5 | 9,600 | 41,000 | 1.9 × 10⁶ | 2.8 |
| M-TD | 5.5 | 9,600 | 33,000 | 1.2 × 10⁶ | 3.4 |
| N-MD | 3.5 | 6,400 | 36,000 | 2.1 × 10⁶ | 2.0 |
| N-TD | 3.5 | 6,400 | 25,000 | 1.3 × 10⁶ | 2.0 |

EXAMPLE 23

Preparation of Blends of Poly-1,4-(4'-phenoxybenzoylphenylene) with Polybutylene Terephthalate (PBT) by Melt Extrusion/Injection Molding.

Blends of poly-1,4-(4'-phenoxy-benzoylphenylene)([η]= 5.5 dL/g in 0.05M LiBr/NMP at 40° C.) and polybutylene terephthalate (e.g. NOVADUR PBT from Mitsubishi Kasei Corporation; [η]=1.1 dL/g in 1/1 1,1,2,2-tetrachloroethane/phenol) were prepared by conventional melt extrusion and test samples (40 mm length×6 mm width×1 mm thickness) were obtained by injection molding at 280° C. Relative to samples prepared from pure polybutylene terephthalate, the blend samples typically demonstrated better flexural strength and modulus (ASTM-D-790) and shown below (MD, machine direction, refers to specimens molded in the long direction (40 mm) to induce some orientation and TD, transverse direction, refers to specimens molded in the short direction (6 mm) to minimize any orientation):

| Sample Identification | Polyparaphenylene (wt %) | Melt Viscosity (poise) | Flexural Strength (psi) | Flexural Modulus (psi) | Flexural Strain (%) |
|---|---|---|---|---|---|
| M-MD | 100 | 9,600 | 41,000 | $1.9 \times 10^6$ | 2.8 |
| M-TD | 100 | 9,600 | 33,000 | $1.2 \times 10^6$ | 3.4 |
| O-MD | 40 | 2,200 | 12,000 | $0.4 \times 10^6$ | 3.5 |
| O-TD | 40 | 2,200 | 10,400 | $0.4 \times 10^6$ | 3.0 |
| P-MD | 20 | 1,050 | 12,600 | $0.3 \times 10^6$ | 7.2 |
| P-TD | 20 | 1,050 | 12,200 | $0.3 \times 10^6$ | 8.6 |
| Q-MD | 0 | 1,100 | 10,600 | $0.3 \times 10^6$ | 13.3 |
| Q-TD | 0 | 1,100 | 10,300 | $0.2 \times 10^6$ | 7.7 |

EXAMPLE 24

Preparation of Blends of Poly-1,4-(4'-phenoxybenzoylphenylene) with Other Resins by Melt Mixing.

The polymer blends were prepared in a small (50 g) Brabender mixer (C.W. Brabender, Inc.; Hackensack, N.J.). The particular batch of poly-1,4-(4'-phenoxybenzoylphenylene) used for these experiments possessed the following properties: [η]=3.5 dL/g (0.05M LiBr/NMP at 40° C.); $M_w^{GPC}$=275,000; $T_g$ (DSC)=143° C.; and melt viscosity (at 300° C. and 1,000/sec shear rate)=4,100 poise. The mixer was preheated to the temperature indicated below for the specified polymer to be blended with poly-1,4-(4'-phenoxybenzoylphenylene), and the resin was added slowly and allowed to achieve uniform melt consistence over about 5 minutes. The poly-1,4-(4'-phenoxybenzoylphenylene) or a mixture of poly-1,4-(4'-phenoxybenzoylphenylene) and triphenylphosphate (TPP; used as a plasticizer to lower the melt viscosity of the polyparaphenylene) was then added. If the blend was not uniform after about 5 minutes of mixing, the temperature was increased to about 280°–300° C. for 5 minutes. The mixer was then cooled to 165° C., and the blend was removed and allowed to cool to room temperature. The following blends were prepared in this manner:

| Sample Identification | Base Resin | Polyparaphenylene (wt %) | Triphenyl Phosphate (wt %) | Initial Temp. (°C.) |
|---|---|---|---|---|
| PS-1 | Polystyrene | 0 | 10 | 175 |
| PS-2 | Polystyrene | 5.0 | 10 | 175 |
| PPO-1 | Poly(phenylene oxide) | 0.0 | 0 | 200 |
| PPO-2 | Poly(phenylene oxide) | 10.0 | 0 | 200 |
| NY-1 | Nylon-6 | 0.0 | 0 | 220 |
| NY-2 | Nylon-6 | 10.1 | 0 | 220 |

Polystyrene = HCC9100 from Hunter Chemical Co.; Poly(phenylene oxide) = Noryl 731 from GE Plastics; Nylon-6 (poly-ε-caprolactam) = DYLARK 232 from ARCO Chemical.

Compression molded panels of the above blends were prepared for mechanical (tensile) testing according to ASTM-D-638 standards by molding at the temperature specified below at about 700 psi for 2 minutes and then cooling to room temperature. The glass transition temperatures ($T_g$) were determined for the blends by dynamic mechanical thermal analysis (DMTA) of the compression molded parts. Specimens appropriate for DMTA and mechanical testing (size approximately 6"×0.5"×0.1") were prepared from the molded panels by using a band-saw and/or a router. The following data was obtained:

| Sample Identification | Molding Temp. (°C.) | Tensile Strength (psi) | Tensile Modulus (psi) | Glass Transition ($T_g$/°C.) |
|---|---|---|---|---|
| PS-1 | 175 | 2,900 | $5.1 \times 10^5$ | 89.5 |
| PS-2 | 175 | 3,400 | $5.3 \times 10^5$ | 91.5 |
| PPO-1 | 175 | 7,100 | $2.6 \times 10^5$ | 152 |
| PPO-2 | 175 | 7,000 | $3.7 \times 10^5$ | 155 |
| NY-1 | 235 | 7,200 | $3.7 \times 10^5$ | 226 |
| NY-2 | 235 | 4,800 | $4.7 \times 10^5$ | 225 |

EXAMPLE 25

Preparation of Blends of Poly-1,4-(benzoylphenylene) with Other Resins by Melt Mixing.

The polymer blends were prepared in a small (50 g) Brabender mixer (C.W. Brabender, Inc.; Hackensack, N.J.). The particular batch of poly-1,4-(benzoylphenylene) used for these experiments possessed the following properties: [η]=3.5 dL/g (0.05M LiBr/NMP at 40° C.); $M_w^{GPC}$=300,000; and melt viscosity (at 300° C. and 100/sec shear rate)=27,000 poise. The mixer was preheated to the temperature indicated below for the specified polymer to be blended with poly-1,4-(benzoylphenylene), and the resin was added slowly and allowed to achieve uniform melt consistence over about 5 minutes. The poly-1,4-(benzoylphenylene) or a mixture of poly-1,4-(benzoylphenylene) and triphenylphosphate (TPP; used as a plasticizer to lower the melt viscosity of the polyparaphenylene) was then added. If the blend was not uniform after about 5 minutes of mixing, the temperature was increased to about 280°–300° C. for 5 minutes. The mixer was then cooled to 165° C., and the blend was removed and allowed to cool to room temperature. The following blends were prepared in this manner:

| Sample Identification | Base Resin | Polyparaphenylene (wt %) | Triphenyl Phosphate (wt %) | Initial Temp. (°C.) |
|---|---|---|---|---|
| PS-1 | Polystyrene | 0.0 | 10 | 175 |
| PS-3 | Polystyrene | 2.5 | 10 | 175 |
| PS-4 | Polystyrene | 5.0 | 10 | 175 |
| PPO-1 | Poly(phenylene oxide) | 0.0 | 0 | 200 |
| PPO-3 | Poly(phenylene oxide) | 10.2 | 0 | 200 |
| PP-1 | Polypropylene | 0.0 | 0 | 175 |
| PP-2 | Polypropylene | 1.3 | 0 | 175 |
| PP-3 | Polypropylene | 0.0 | 10 | 175 |
| PP-4 | Polypropylene | 5.0 | 10 | 175 |
| PE-1 | Polyethylene | 0.0 | 0 | 175 |
| PE-2 | Polyethylene | 1.0 | 0 | 175 |

Polystyrene = HCC9100 from Hunter Chemical Co.; Poly(phenylene oxide) = Noryl 731 from GE Plastics; Polypropylene = Profax 6523 from Himont; Polyethylene (high density) = # 8640 from Chevron.

Compression molded panels of the above blends were prepared for mechanical (tensile) testing according to ASTM-D-638 standards by molding at the temperature specified below at about 700 psi for 2 minutes and then cooling to room temperature. The glass transition temperatures ($T_g$) were determined for the blends by dynamic mechanical thermal analysis (DMTA) of the compression molded parts. Specimens appropriate for DMTA and mechanical testing (size approximately 6"×0.5"×0.1") were prepared from the molded panels by using a band-saw and/or a router. The following data was obtained:

| Sample Identi- fication | Molding Temp. (°C.) | Tensile Strength (psi) | Tensile Modulus (psi) | Glass Transition ($T_g$/°C.) |
|---|---|---|---|---|
| PS-1 | 175 | 2,900 | 5.1 × 10⁵ | 92 |
| PS-3 | 175 | 3,200 | 5.1 × 10⁵ | 90 |
| PS-4 | 175 | 3,700 | 5.0 × 10⁵ | 91 |
| PPO-1 | 175 | 7,100 | 2.6 × 10⁵ | 152 |
| PPO-3 | 175 | 6,800 | 3.9 × 10⁵ | 155 |
| PP-1 | 175 | 2,300 | 2.7 × 10⁵ | 155 |
| PP-2 | 175 | 2,600 | 2.7 × 10⁵ | 157 |
| PP-3 | 175 | 3,500 | 1.9 × 10⁵ | 155 |
| PP-4 | 175 | 3,400 | 1.9 × 10⁵ | 158 |
| PE-1 | 175 | 2,300 | 0.3 × 10⁵ | N/A |
| PE-2 | 175 | 2,200 | 0.6 × 10⁵ | N/A |

EXAMPLE 26

Preparation of Blends of Poly-1,4-(benzoylphenylene) with Polystyrene by Solution Mixing.

The polymer blends were prepared by mixing solutions of each polymer in chloroform or a solvent mixture comprised of 90% (vol/vol) chloroform and 10% (vol/vol) NMP in proper proportion to achieve the compositions specified below. The particular batch of poly-1,4(benzoylphenylene) used for these experiments possessed the following properties: [η]=3.5 dL/g (0.05M LiBr/NMP at 40° C.); $M_w^{GPC}$= 300,000; and melt viscosity (at 300° C. and 100/sec shear rate)=27,000 poise. The polystyrene was obtained from Hunter Chemical Co. (HCC9100). The blended resins were rapidly precipitated by pouring the co-solutions into methanol (3 volumes relative to the volume of polymer co-solution). The precipitate was filtered, washed with additional methanol, and dried under vacuum for 24 hours at 70° C. compression molded panels of these blends were prepared for mechanical (tensile) testing according to ASTM-D-638 standards by molding at 175° C. at about 700 psi for 2 minutes and then cooling to room temperature. The glass transition temperatures ($T_g$) were determined for the blends by dynamic mechanical thermal analysis (DMTA) of the compression molded parts. Specimens appropriate for DMTA and mechanical testing (size approximately 6"×0.5"× 0.1") were prepared from the molded panels by using a band-saw and/or a router. The following data was obtained:

| Sample Identi- fication | Solvent(s) | Polypara- phenylene (wt %) | Tensile Strength (psi) | Tensile Modulus (psi) | Glass Transition ($T_g$/°C.) |
|---|---|---|---|---|---|
| PS-5 | chloroform | 0.0 | 2,100 | 4.9 × 10⁵ | 109 |
| PS-6 | chloroform | 1.0 | 2,200 | 4.5 × 10⁵ | N/A |
| PS-7 | chloroform | 5.0 | 2,400 | 4.8 × 10⁵ | N/A |
| PS-8 | chloroform | 20.0 | 2,600 | 5.5 × 10⁵ | 115 |
| PS-9 | chloroform/ NMP | 10.2 | 2,300 | 5.8 × 10⁵ | 110 |

EXAMPLE 27

Preparation of Blends of Poly-1,4-(4'-phenoxybenzoylphenylene) with Polycarbonate by Solution Mixing.

The polymer blends were prepared by mixing solutions of each polymer in chloroform in proper proportion to achieve the compositions specified below. The particular batch of poly-1,4-(benzoylphenylene) used for these experiments possessed the following properties: [η]=5.2 dL/g (0.05M LiBr/NMP at 40° C.) and $M_w^{GPC}$=450,000. The polycarbonate was obtained from Mitsubishi Kasei Corporation (NOVAREX polycarbonate). The blended solutions were then cast onto a glass plate and dried rapidly to afford transparent free-standing thin film samples. The following mechanical (tensile) properties were measured according to ASTM-D-882 specifications:

| Sample Identi- fication | Polypara- phenylene (wt %) | Tensile Strength (psi) | Tensile Modulus (psi) | Elongation (%) |
|---|---|---|---|---|
| PC-1 | 0 | 7,200 | 3.2 × 10⁵ | 8.6 |
| PC-2 | 10 | 7,800 | 3.9 × 10⁵ | 3.4 |
| PC-3 | 20 | 7,100 | 5.7 × 10⁵ | 1.6 |
| PC-4 | 40 | 17,400 | 7.0 × 10⁵ | 2.0 |
| PC-5 | 80 | 18,100 | 11.3 × 10⁵ | 1.9 |
| PC-6 | 100 | 21,000 | 15.6 × 10⁵ | 1.8 |

EXAMPLE 28

Solutions containing 1.5 to 3 wt. % of poly-1,4-(benzoylphenylene) provided in accordance with Example 1 in Epomik R140 (Mitsui) were prepared by stirring the polymer and the epoxy resin at 100°–140° C. The resulting solutions were almost colorless. Both 1.5 and 3 wt % solutions were very viscous at room temperature, however, the viscosity of the solution dropped sharply with warming. To about 1 g of solution of the polymer of Example 1 in Epomik R140 was added 6–12 drops of ethylenediamine (EDA). The resulting solution was mixed with a spatula until a homogeneous solution was obtained. The mixture was left to sit at room temperature to cure. Curing took from a few hours to two days depending on the amount of EDA. In all cases, a hard transparent mass was obtained. If the polymer mixture with EDA was heated to about 70° C. a very exothermic reaction occurred. The resulting cured polymer blend in this case was slightly turbid. Curing was also successful when a small amount of NMP was used as plasticizer.

EXAMPLE 29

Determination of the Relative Coupling Reactivities of Monohaloarene Model Compounds Using Nickel-Triarylphosphine Catalysts.

A mixture of 50 mg (0.39 mmole) of anhydrous nickel chloride, 175 mg (1.17 mmole) of sodium iodide, 750 mg (2.86 mmole) of triphenylphosphine, 1.0 g (15.30 mmole) of activated zinc powder, 500 mg (2.17 mmole) of orthoterphenyl (used as an internal standard for chromatographic analysis), and 7 ml of NMP was placed into a flask under an inert atmosphere and heated at 50° C. for 10–15 minutes until the mixture achieved a deep red coloration, indicative of an activated catalyst solution. Then approximately 19.3 mmole (50 mole equivalents vs. anhydrous nickel chloride) of the desired monohaloarene model compound was added to the flask. The course of the reaction was then followed by monitoring the disappearance of the monohaloarene model compound by standard quantitative gas chromatographic (GC) or high pressure liquid chromatographic (HPLC) techniques. Two simple approaches were utilized to quantify the reactivities of the model compounds: (1) extent of reaction (conversion) of the model compound after two hours and (2)

the amount of time required to achieve at least 90% conversion. The first technique requires fewer measurements but can be strongly affected if there is any initiation period. The following data was obtained by the above technique for the specified monohaloarene model compounds:

| Monohaloarene Model Compound | Conversion at 2 hrs | Time for 90% Conversion |
|---|---|---|
| chlorobenzene | >95% | 30–40 min |
| 2-chloroanisole | <5% | ≦23 hrs |
| 3-chloroanisole | >90% | 1.5–2.0 hrs |
| 2-chlorobenzotrifluoride | ≦5% | N/A |
| 3-chlorobenzotrifluoride | >95% | ≦1 hr |
| 2-chlorobenzoylmorpholine | 5–10% | >40 hrs |
| 3-chlorobenzoylmorpholine | ≧90% | 1.5–2.0 hrs |
| 4-chlorobenzoylmorpholine | 50–60% | N/A |
| 2-chloroacetophenone | >95% | 30 min |
| 3-chloroacetophenone | >95% | 30 min |
| 2-chlorobenzophenone | >90% | 2 hrs |
| 3-chlorobenzophenone | 60–80% | 2.5–3.0 hrs |
| 2-chlorophenylacetate | 10–15% | >24 hrs |
| ethyl-2-chlorobenzoate | <10% | >24 hrs |

EXAMPLE 30

Poly-1,4-(2'-methylbenzoylphenylene)

2,5-Dichloro-2'-methylbenzophenone

A mixture of o-toluoyl chloride (22 g, 0.17 mol) and 1,4-dichlorobenzene (120 g, 0.82 mol) was heated to 100° C. in a flask. Aluminum chloride (60 g, 0.45 mol) was added in one portion. The mixture was heated to 170° C. in 30 min and stirred at this temperature for 3 hours. The resulting brownish solution was cooled to about 80° C. and poured onto ice. Ether (50 ml) was added. The organic layer was separated and distilled under vacuum after the removal of ether. The residue from distillation was recrystallized twice from hexane to give 16 g of white crystals (36%).

Poly-1,4-(2'-methylbenzoylphenylene)

Anhydrous nickel(II) chloride (60 mg, 0.47 mmol), sodium iodide (175 mg, 1.17 mmol), triphenylphosphine (0.75 g, 2.86 mmol), activated zinc dust (2.3 g, 35.9 mmol) were weighted in a glove box into a 100 ml round bottom flask containing NMP (8 ml). This mixture was stirred with a magnetic stirrer for 30 min at 50° C., leading to a deep red solution. A solution of 2,5-Dichloro-2'-methylbenzophenone (10 mmol) in NMP (7 ml) was added. Stirring was continued for about 40 minutes until a viscous solution was obtained. The mixture was kept at 65° C. for another 2–3 days. Ethanol was added to the reaction mixture. The solid was moved into a blender, ground into small pieces and then stirred with 50 ml of 1 molar hydrochloric acid in ethanol for 2 hours. The off-white solid was filtered and stirred with acetone overnight. Filtration and vacuum drying gave off-white or pale yellow powder. The weight average molecular weight relative to polystyrene standard according to GPC analysis was 70,000.

EXAMPLE 31

Poly-1,4-(2',5'-dimethylbenzoylphenylene)

2,5-Dichloro-2',5'-dimethylbenzophenone

To p-xylene (120 ml, 0.98 mol) was added aluminum chloride (32 g, 0.24 mol) at room temperature. To this mixture 2,5-dichlorobenzoyl chloride (30 g, 0.14 mol) was added slowly. The reaction was exothermic and hydrogen chloride evolved from the reddish solution. After the addition, the mixture was stirred for 10 min and then hydrolysed by slow addition of water. The aqueous layer was extracted with ether. The organic layer was combined with ethereal extract and washed with water, saturated sodium bicarbonate, brine, respectively, and then dried with magnesium sulfate. After the removal of solvent, the residue was recrystallized from methanol twice and then from hexane to give 36.8 g (92%) crystals (mp 58°–61° C.).

Poly-1,4-(2',5'-dimethylbenzoylphenylene)

Anhydrous nickel(II) chloride (60 mg, 0.47 mmol), sodium iodide (175 mg, 1.17 mmol), triphenylphosphine (0.75 g, 2.86 mmol), activated zinc dust (2.3 g, 35.9 mmol) were weighted in a glove box into a 100 ml round bottom flask containing NMP (8 ml). This mixture was stirred with a magnetic stirrer for 30 min at 50° C., leading to a deep red solution. A solution of 2,5-Dichloro-2',5'-dimethylbenzophenone (10 mmol) in NMP (7 ml) was added. Stirring was continued for about 40 minutes until a viscous solution was obtained. The mixture was kept at 65° C. for another 2–3 days. Ethanol was added to the reaction mixture. The solid was moved into a blender, ground into small pieces and then stirred with 50 ml of 1 molar hydrochloric acid in ethanol for 2 hours. The off-white solid was filtered and stirred with acetone overnight. Filtration and vacuum drying gave off-white or pale yellow powder. The weight average molecular weight relative to polystyrene standard was 50,000 according to GPC analysis.

EXAMPLE 32

Poly-1,4-(2-(2-pyrrolidinon-1-yl)ethoxycarbonylphenylene)

2-(2-Pyrrolidinon-1-yl)ethyl 2,5-dichlorobenzoate

A mixture of 2,5-dichlorobenzoic acid (20 g, 0.11 mol), 1-(2-hydroxyethyl-2-pyrrolidinone (27 g, 0.22 mol) in benzene (100 ml) was refluxed in the presence of 1 ml of concentrate sulfuric acid for 24 hours. About 2.2 ml of water was collected. The mixture was cooled and washed with aqueous sodium bicarbonate and water, respectively and evaporated. The residue was purified by recrystallization from hexane and ethyl acetate to give the esters as white crystals (10 g, 32%).

Poly-1,4-(2-(2-pyrrolidinon-1-yl)ethoxycarbonylphenyene)

Anhydrous nickel(II) chloride (60 mg, 0.47 mmol), sodium iodide (175 mg, 1.17 mmol), triphenylphosphine (0.75 g, 2.86 mmol), activated zinc dust (2.3 g, 35.9 mmol) were weighted in a glove box into a 100 ml round bottom flask containing NMP (8 ml). This mixture was stirred with a magnetic stirrer for 30 min at 50° C., leading to a deep red solution. A solution of 2-(2-Pyrrolidinon-1-yl)ethyl 2,5-dichlorobenzoate (10 mmol) in NMP (7 ml) was added. Stirring was continued for about one week and a viscous solution was obtained. The mixture was kept at 65° C. for another 2–3 days. Ethanol was added to the reaction mixture. The solid was moved into a blender, ground into small pieces and then stirred with 50 ml of 1 molar hydrochloric acid in ethanol for 2 hours. The off-white solid was filtered and stirred with acetone overnight. Filtration and vacuum drying gave off-white or pale yellow powder. The polymer has structure I with $R_1=$

—CO₂CH₂CH₂NCOCH₂CH₂CH₂, and R₂–R₄=H. The weight average molecular weight, relative to polystyrene standard according to GPC analysis was 72,000.

EXAMPLE 33

Poly-1,4-(4'-(2-phenoxyethoxy)benzoylphenylene)

2,5-Dichloro-4'-(2-phenoxyethoxy)benzophenone

To a suspension of 1,2-diphenoxyethane (25 g, 0.11 mol), aluminum chloride (14 g, 0.11 mol) in chlorobenzene (400 ml) was added slowly 2,5-dichlorobenzoyl chloride (9.8 g, 0.05 mol) at 0° C. After the addition, the mixture was stirred for another 20 minutes and worked up as usual. After the removal of solvent, the residue was purified by chromatography on silica gel and recrystallization from cyclohexane to give 9 g pure ketone (50%).

Poly-1,4-(4'-(2-phenoxyethoxy)benzoylphenylene)

Anhydrous nickel(II) chloride (60 mg, 0.47 mmol), sodium iodide (175 mg, 1.17 mmol), triphenylphosphine (0.75 g, 2.86 mmol), activated zinc dust (2.3 g, 35.9 mmol) were weighted in a glove box into a 100 ml round bottom flask containing NMP (8 ml). This mixture was stirred with a magnetic stirrer for 30 min at 50° C., leading to a deep red solution. A solution of 2,5-Dichloro-4'-(2-phenoxyethoxy)-benzophenone (10 mmol) in NMP (7 ml) was added. Stirring was continued until a viscous solution was obtained, about 3 hours. The mixture was kept at 65° C. for another 2–3 days. Ethanol was added to the reaction mixture. The solid was moved into a blender, ground into small pieces and then stirred with 50 ml of 1 molar hydrochloric acid in ethanol for 2 hours. The off-white solid was filtered and stirred with acetone overnight. Filtration and vacuum drying give off-white or pale yellow powder. The weight average molecular weight relative to polystyrene standard was 218,000 by GPC analysis.

The above descriptions of exemplary embodiments of processes for producing rigid-rod and segmented rigid-rod polymers, and the rigid-rod and segmented rigid-rod polymers produced by the processes, are for illustrative purposes. Because of variations which will be apparent to those skilled in the art, the present invention is not intended to be limited to the particular embodiments described above. The scope of the invention is defined in the following claims.

We claim:

1. A soluble rigid rod polymer having repeat units of the formula:

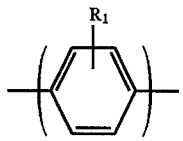

wherein $R_1$ is a solubilizing side group having molecular weight of from about 15 to about 300, and wherein the intrinsic viscosity of said polymer is greater than about 3 deciliters/gram when measured at 40° C. in a solvent selected from the group consisting of 0.05M lithium bromide in N-methylpyrrolidinone, N-methylpyrrolidinone, dimethylacetamide, phenylether, m-cresol, sulfuric acid, anisole, 5% N-methylpyrrolidinone/95% CHCl₃, and chlorobenzene.

2. The polymer of claim 1 where at least about 30% of the monomer units bear a solubilizing side group.

3. The polymer of claim 1 where $R_1$ is:

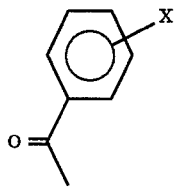

and wherein X is selected from the group consisting of hydrogen, amino, methylamino, dimethylamino, benzoyl, hydroxy, methoxy, phenoxy, —SC₆H₅, and —OCOCH₃.

4. The polymer of claim 1 where $R_1$ is:

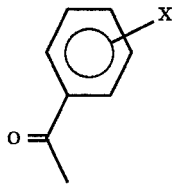

and wherein X is selected from the group consisting of methyl, ethyl, phenyl, benzyl, F, and CF₃, and n is 1, 2, 3, 4, or 5.

5. The polymer of claim 1 wherein $R_1$ is —CR₅R₆Ar where Ar is aryl, and R₅ and R₆ are independently selected from the group consisting of H, methyl, F, C1 to C20 alkoxy, and OH or R₅ and R₆ taken together as bridging groups are selected from the group consisting of —OCH₂CH₂O—, —OCH₂CH(CH₂OH)O—, OC₆H₄O—, —OC₆H₁₀O— and —OCH₂CHR₃O— where R₃ is selected from the group consisting of alkyl and aryl.

6. The polymer of claim 1 wherein $R_1$ is —(CO)X and X is selected from the group consisting of 2-pyridyl, 3-pyridyl, 4-pyridyl, —CH₂C₆H₅, —CH₂CH₂C₆H₅, 1-naphthyl and 2-naphthyl.

7. The polymer of claim 1 wherein $R_1$ is —SO₂X and X is selected from the group consisting of phenyl, tolyl, 1-naphthyl, 2-naphthyl, methoxyphenyl, and phenoxyphenyl.

8. The polymer of claim 1 wherein $R_1$ is —NR₅R₆ and wherein R₅ and R₆ are independently selected from the group consisting of hydrogen, methyl, ethyl, phenyl, and —COCH₃ or R₅ and R₆ taken together as bridging groups are selected from the group consisting of —CH₂CH₂OCH₂CH₂—, —CH₂CH₂CH₂CH₂CH₂— and —CH₂CH₂CH₂CH₂—.

9. The polymer of claim 1 wherein $R_1$ is —N=CR₅R₆ and wherein R₅ and R₆ are independently selected from the group consisting of —H, —CH₃, —CH₂CH₃, phenyl, tolyl, methoxyphenyl, benzyl, aryl, and C1 to C22 alkyl, or R₅ and R₆ taken together as bridging groups are selected from the group consisting of —CH₂CH₂OCH₂CH₂—, —CH₂CH₂CH₂CH₂CH₂— and —CH₂CH₂CH₂CH₂—.

10. A free-standing film comprising a polymer of claim 1.

11. A fiber comprising a polymer of claim 1.

12. A molded article comprising a polymer of claim 1.

13. A coating composition comprising a polymer of claim 1.

14. The polymer of claim 1 where the intrinsic viscosity of said polymer is greater than about 3.5 deciliters/gram when measured at 40° C. in a solvent selected from the group consisting of 0.05M lithium bromide in N-methylpyrrolidinone, N-methylpyrrolidinone, dimethylacetamide, phenylether, m-cresol, sulfuric acid, anisole, 5% N-methylpyrrolidinone/95% CHCl₃, and chlorobenzene.

15. The polymer of claim 1 where the intrinsic viscosity of said polymer is greater than about 5 deciliters/gram when measured at 40° C. in a solvent selected from the group consisting of 0.05M lithium bromide in N-methylpyrrolidinone, N-methylpyrrolidinone, dimethylacetamide, phenylether, m-cresol, sulfuric acid, anisole, 5% N-methylpyrrolidinone/95% CHCl₃, and chlorobenzene.

16. The polymer of claim 1 where the intrinsic viscosity of said polymer is greater than about 7.2 deciliters/gram when measured at 40° C. in a solvent selected from the group consisting of 0.05M lithium bromide in N-methylpyrrolidinone, N-methylpyrrolidinone, dimethylacetamide, phenylether, m-cresol, sulfuric acid, anisole, 5% N-methylpyrrolidinone/95% CHCl₃, and chlorobenzene.

17. The polymer of claim 1 where the weight average molecular weight of said polymer as measured by gel permeation chromatography against polystyrene standards is greater than about 218,000.

18. The polymer of claim 1 where the weight average molecular weight of said polymer as measured by gel permeation chromatography against polystyrene standards is greater than about 500,000.

19. The polymer of claim 1 wherein the tensile modulus of unoriented 25 micron film of said polymer is greater than about one million pounds per square inch.

20. A soluble rigid-rod copolymer having repeat units of the formula:

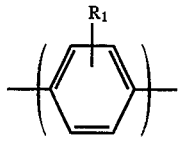

wherein $R_1$ is independently selected from H or a solubilizing side group having molecular weight of from about 15 to about 300, wherein the intrinsic viscosity of said copolymer is greater than about 3 dl/g when measured at 40° C. in a solvent selected from the group consisting of 0.05M lithium bromide in N-methylpyrrolidinone, N-methylpyrrolidinone, dimethylacetamide, phenylether, m-cresol, sulfuric acid, anisole, 5% N-methylpyrrolidinone/ 95% CHCl₃, and chlorobenzene, wherein at least about 30% of the monomer units bear a solubilizing side group, and wherein a portion of the monomer units are absent a solubilizing side group.

* * * * *